(12) United States Patent
Joo

(10) Patent No.: US 11,600,344 B2
(45) Date of Patent: Mar. 7, 2023

(54) MEMORY DEVICE AND METHOD OF OPERATING THE MEMORY DEVICE INCLUDING PROGRAM VERIFY OPERATION WITH PROGRAM VOLTAGE ADJUSTMENT

(71) Applicant: SK hynix Inc., Icheon-si (KR)

(72) Inventor: Byoung In Joo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/021,620

(22) Filed: Sep. 15, 2020

(65) Prior Publication Data

US 2021/0319838 A1 Oct. 14, 2021

(30) Foreign Application Priority Data

Apr. 8, 2020 (KR) .......... 10-2020-0042843

(51) Int. Cl.
| | | |
|---|---|---|
| *G11C 16/34* | (2006.01) | |
| *G11C 16/12* | (2006.01) | |
| *G11C 16/08* | (2006.01) | |
| *G11C 16/30* | (2006.01) | |
| *G11C 16/26* | (2006.01) | |

(52) U.S. Cl.
CPC .......... *G11C 16/3459* (2013.01); *G11C 16/08* (2013.01); *G11C 16/12* (2013.01); *G11C 16/26* (2013.01); *G11C 16/30* (2013.01)

(58) Field of Classification Search
None
See application file for complete search history.

(56) References Cited

U.S. PATENT DOCUMENTS

| | | | | |
|---|---|---|---|---|
| 2002/0191444 A1* | 12/2002 | Gregori | ............... | G11C 11/5628 365/185.19 |
| 2007/0058446 A1* | 3/2007 | Hwang | .............. | G11C 16/3459 365/185.29 |
| 2014/0063968 A1* | 3/2014 | Shim | ................. | G11C 16/3459 365/185.19 |

(Continued)

FOREIGN PATENT DOCUMENTS

| | | |
|---|---|---|
| KR | 1020100006666 A | 1/2010 |
| KR | 101046839 B1 | 7/2011 |
| KR | 101090328 B1 | 12/2011 |

(Continued)

*Primary Examiner* — J. H. Hur
(74) *Attorney, Agent, or Firm* — William Park & Associates Ltd.

(57) ABSTRACT

Provided herein may be a memory device and a method of operating the memory device. The memory device includes an operation code generator configured to generate a program code and a verify code in response to a program control code and to output an operation code using the program code and the verify code, a verify counter configured to store a count value acquired by counting the number of verify operations that are performed depending on the verify code, a verify determiner configured to compare the count value with a reference value depending on the result of the verify operation and to generate the program control code to change a step voltage for raising a program voltage depending on the comparison result, and a voltage generator configured to generate the program voltage and a verify voltage depending on the operation code.

18 Claims, 19 Drawing Sheets

(56) References Cited

U.S. PATENT DOCUMENTS

2017/0337969 A1* 11/2017 Shikata .............. G11C 16/3459

FOREIGN PATENT DOCUMENTS

| KR | 1020170085774 A | 7/2017 |
| KR | 1020170085776 A | 7/2017 |
| KR | 1020170116068 A | 10/2017 |
| KR | 1020180110708 A | 10/2018 |

* cited by examiner

MEMORY DEVICE AND METHOD OF OPERATING THE MEMORY DEVICE INCLUDING PROGRAM VERIFY OPERATION WITH PROGRAM VOLTAGE ADJUSTMENT

CROSS-REFERENCE TO RELATED APPLICATION

The present application claims priority under 35 U.S.C. § 119(a) to Korean patent application number 10-2020-0042843 filed on Apr. 8, 2020, in the Korean Intellectual Property Office, the entire disclosure of which is incorporated by reference herein.

BACKGROUND

1. Technical Field

Various embodiments of the present disclosure generally relate to a memory device and a method of operating the memory device, and more particularly, to a memory device capable of performing a program operation and a method of operating the memory device.

2. Related Art

A memory device may include a volatile memory device in which data stored therein is lost when power supply is interrupted, and a nonvolatile memory device in which data stored therein is retained even when power supply is interrupted.

The volatile memory device may include a dynamic random-access memory (DRAM) and a static random-access memory (SRAM). The nonvolatile memory device may include a read-only memory (ROM), a programmable read-only memory (PROM), an erasable PROM (EPROM), an electrically EPROM (EEPROM), a NAND flash, and the like.

The memory device may include a memory cell array, peripheral circuits, and a logic circuit.

The memory cell array includes a plurality of memory cells, and the plurality of memory cells may store data. A method in which one bit data is stored in a single memory cell is referred to as a single level cell (SLC) method, and a method in which two or more bits of data are stored in a single memory cell is referred to as a multi-level cell (MLC) method. The MLC method may be classified as a triple level cell (TLC) method or a quadruple level cell (QLC) method depending on the number of bits stored in a memory cell. In the TLC method, three bits of data may be stored in a single memory cell, and in the QLC method, four bits of data may be stored in a single memory cell.

Because the interval between threshold voltage distributions that correspond to different program states becomes narrower as the number of bits stored in a memory cell increases, it is necessary to manage the threshold voltages of memory cells so as not to overlap each other in the MLC methods.

Memory cells may have slightly different electrical characteristics due to various reasons. Therefore, a memory cell array, which includes a plurality of memory cells, may include slow cells, the threshold voltage of which is relatively slowly raised during a program operation, and fast cells, the threshold voltage of which is relatively quickly raised during the program operation. That is, as the number of memory cells having different electrical characteristics increases, a program operation time may increase or the interval between threshold voltage distributions of memory cells may decrease.

SUMMARY

An embodiment of the present disclosure may provide for a memory device. The memory device may include an operation code generator configured to generate a program code and a verify code in response to a program control code and to output an operation code using the program code and the verify code, a verify counter configured to store a count value acquired by counting the number of verify operations that are performed depending on the verify code, a verify determiner configured to compare the count value with a reference value depending on the result of the verify operation and to generate the program control code such that a step voltage for raising a program voltage is changed depending on the comparison result, and a voltage generator configured to generate the program voltage and a verify voltage depending on the operation code.

An embodiment of the present disclosure may provide for a method of operating a memory device. The method may include raising the threshold voltage of memory cells by applying a first program voltage to a selected word line, performing a verify operation for determining whether the threshold voltage of the memory cells are equal to or greater than a target voltage, storing a count value by counting the number of times the verify operation is performed, comparing the count value with a reference value when the verify operation fails, setting a step voltage depending on the result of the comparison of the count value with the reference value, and generating a second program voltage that is the step voltage higher than the first program voltage and programming the memory cells using the second program voltage.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure are directed to a memory device capable of improving the reliability of the memory device by adjusting a program operation in consideration of the characteristics of slow cells and fast cells and a method of operating the memory device.

Figure 1:
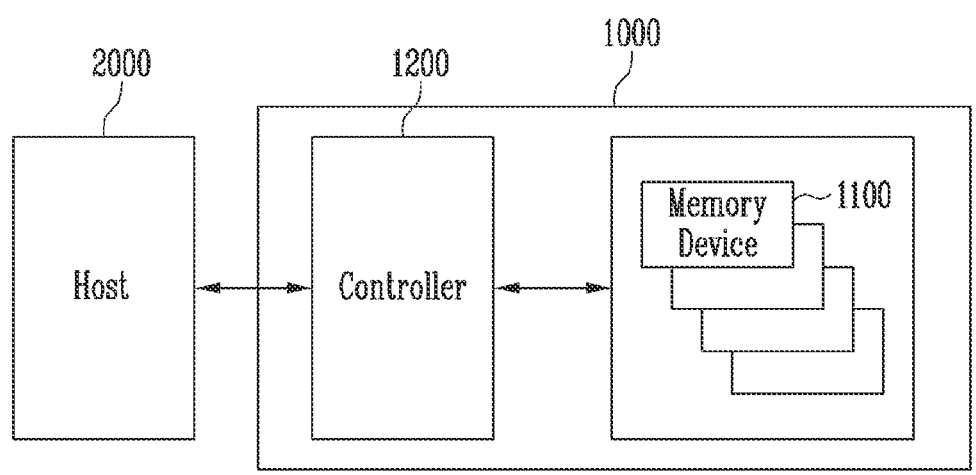
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a memory device 1100 in which data is stored and a controller 1200 configured to communicate between the memory device 1100 and a host 2000.

The memory system 1000 may include a plurality of memory devices 1100, and the memory devices 1100 may be coupled to the controller 1200 through at least one channel. For example, the plurality of memory devices 1100 may be coupled to a single channel, and even when a plurality of channels are coupled to the controller 1200, the plurality of memory devices 1100 may be coupled to each of the channels.

The controller 1200 may transmit a command to the plurality of memory devices 1100. The controller 1200 may control the memory device 1100 in response to a request from the host 2000, and may perform a background operation for improving the performance of the memory system 1000 even though no request is received from the host 2000. The host 2000 may generate requests for various operations, and may output the generated requests to the memory system 1000. For example, the host 2000 may generate a program request for requesting a program operation, a read request for requesting a read operation, an erase request for requesting an erase operation, and the like.

The host 2000 may communicate with the memory system 1000 through any of various interfaces such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), Integrated Drive Electronics (IDE), and the like.

The memory device 1100 according to the present embodiment will be specifically described below.

Figure 2:
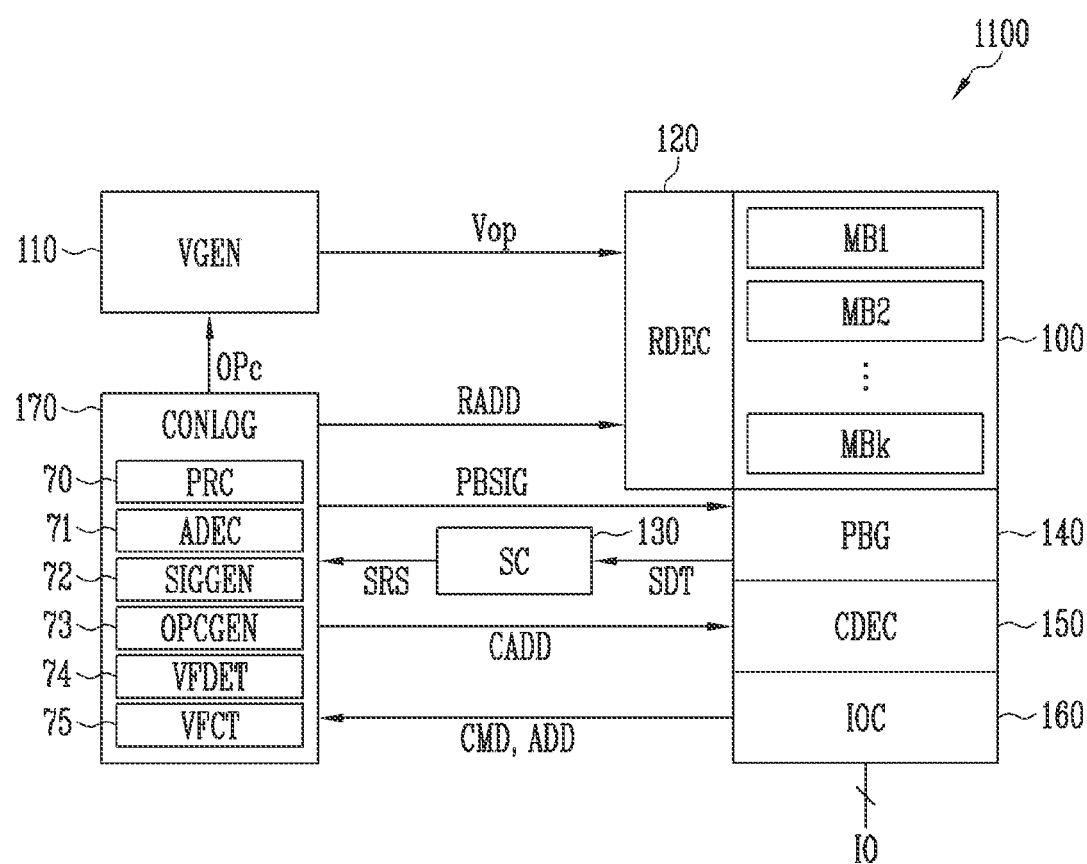
FIG. 2 is a diagram illustrating a memory device according to an embodiment of the present disclosure.

FIG. 2 is a diagram illustrating a memory device according to an embodiment of the present disclosure.

Referring to FIG. 2, the memory device 1100 may include a memory cell array 100 in which data is stored, peripheral circuits 110 to 160 configured to perform a program operation, a read operation, or an erase operation, and a control logic circuit 170 configured to control the peripheral circuits 110 to 160.

The memory cell array 100 may include a plurality of memory blocks MB1 to MBk, in which data is stored (k being a positive integer). Each of the memory blocks MB1 to MBk includes a plurality of memory cells, and the memory cells may be implemented in a 2D structure in which the memory cells are disposed so as to be parallel to a substrate or in a 3D structure in which the memory cells are stacked in a direction perpendicular to the substrate.

The peripheral circuits 110 to 160 may include a voltage generator VGEN 110, a row decoder RDEC 120, a sensing circuit SC 130, a page buffer group PBG 140, a column decoder CDEC 150, and an input/output circuit IOC 160.

The voltage generator 110 may generate and output operation voltages Vop, required for various operations, in response to an operation code OPc. For example, the voltage generator 110 may generate and output a program voltage, a verify voltage, a read voltage, a pass voltage, an erase voltage, and the like. During a program operation, the voltage generator 110 according to the present embodiment may adjust the levels of the program voltage and the verify voltage depending on the operation code OPc.

The row decoder 120 may select one memory block, among the memory blocks included in the memory cell array 100, depending on a row address RADD, and may transmit the operation voltages Vop to the selected memory block.

The sensing circuit SC 130 may output a sensing result signal SRS depending on the sensing data SDT output from the page buffer group 140 during a verify operation. For example, the sensing circuit 130 may output a sensing result signal SRS corresponding to a pass signal or a sensing result signal SRS corresponding to a fail signal depending on the sensing data SDT.

The page buffer group 140 may be coupled to the memory cell array 100 through bit lines. For example, the page buffer group 140 may include page buffers that are coupled to bit lines, respectively. The page buffers may simultaneously operate in response to page buffer control signals PBSIG, and may temporarily store data during a program operation or a read operation. To this end, each of the page buffers may include a plurality of latches for temporarily storing data. The number of latches may vary depending on a program method. For example, the page buffers may be designed differently depending on the number of bits that can be stored in a single memory cell, or may be designed differently depending on the number of verify voltages used in verify operations. Also, the verify voltages may be used in order to determine various threshold voltages of memory cells to be programmed to the same target voltage.

The column decoder 150 may sequentially transmit data DATA between the input/output circuit 160 and the page buffer group 140 depending on a column address CADD.

The input/output circuit 160 may be coupled to the controller 1200 through input/output lines IO. The input/output circuit 160 may input or output a command CMD, an address ADD, and data DATA through the input/output lines IO. For example, the input/output circuit 160 may transmit the command CMD and the address ADD, received through the input/output lines IO, to the control logic circuit 170, and may transmit the data, received through the input/output lines IO, to the page buffer group 140. The input/output circuit 160 may output the data received from the page buffer group 140 to the controller 1200 through the input/output lines IO.

The control logic circuit 170 may output an operation code OPc, a row address RADD, page buffer control signals PBSIG, and a column address CADD in response to a command CMD and an address ADD. For example, the control logic circuit 170 may include software, such as an algorithm executed in compliance with the command CMD, and may include hardware for outputting various codes and signals according to the algorithm.

The control logic circuit 170 may include a processor PRC 70, an address decoder ADEC 71, a signal generator SIGGEN 72, an operation code generator OPCGEN 73, a verify determiner VFDET 74, and a verify counter 75. The components of the control logic circuit 170 may be implemented as circuits including at least one of transistors, operational amplifiers, and power sources.

The processor 70 may store software capable of executing an algorithm for a program operation, a read operation or an erase operation in response to a command CMD. In the present embodiment, the program operation may be performed using an incremental step pulse program (ISPP) method in which a program voltage is gradually raised until the threshold voltage of selected memory cells reaches a target voltage. The program operation of the ISPP method may include a program voltage application operation for raising the threshold voltage of the selected memory cells and a verify operation for determining whether the threshold voltage of the selected memory cells reaches the target voltage. The program voltage application operation and the verify operation may form a single program loop, and the program operation may include a plurality of program loops.

The address decoder 71 may output a row address RADD and a column address CADD by decoding a received address ADD. The signal generator 72 may output page buffer control signals PBSIG under the control of the processor 70.

The operation code generator 73 may output an operation code OPc under the control of the processor 70 or the verify determiner 74. For example, the operation code generator 73 may output an operation code OPc for performing a first program loop under the control of the processor 70, and may output an operation code OPc under the control of the verify determiner 74 from a second program loop.

The verify determiner 74 may receive count values from the verify counter 75 depending on a sensing result signal SRS, and may output a program control code by comparing the received count values. The program control code may be input to the operation code generator 73. The verify counter 75 may count the number of verify operations or the number of verify voltages depending on the verify code output from the operation code generator 73, and may reset the count value at a specific time.

Figure 3:
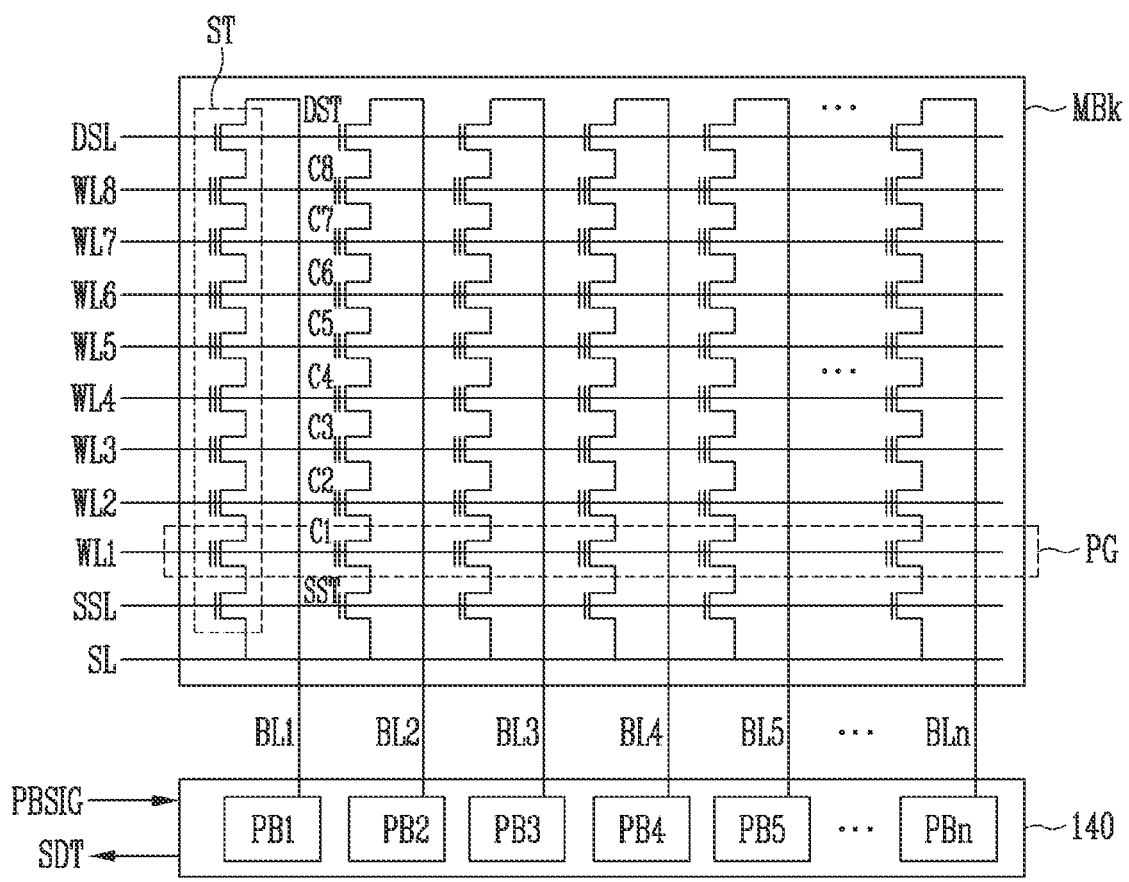
FIG. 3 is a diagram illustrating a memory block.

FIG. 3 is a diagram illustrating a memory block.

Referring to FIG. 3, the k-th memory block MBk may include a plurality of strings ST coupled between a source line SL and first to n-th bit lines BL1 to BLn (n being a positive integer). Each of the strings ST may include a source select transistor SST, first to eighth memory cells C1 to C8, and a drain select transistor DST, which are coupled in series between the source line SL and the first to n-th bit lines BL1 to BLn. That is, a single string ST may be coupled between a single bit line (e.g., BL1) and the source line SL, and the string ST may include the source select transistor SST, the first to eighth memory cells C1 to C8, and the drain select transistor DST, which are coupled to each other in series.

Because the k-th memory block MBk illustrated in FIG. 3 is an example illustrating the configuration of a memory block, the number of source select transistors SST, the number of first to eighth memory cells C1 to C8, and the number of drain select transistors DST are not limited to the numbers illustrated in FIG. 3.

The gates of the source select transistors SST coupled to different strings ST may be coupled to a source select line SSL, the gates of the first to eighth memory cells C1 to C8 may be coupled to first to eighth word lines WL1 to WL8, respectively, and the gates of the drain select transistors DST may be coupled to a drain select line DSL.

The memory cells coupled to the same word line and included in different strings ST may form a single page PG. The memory cells may be programmed or read in units of pages PG. The page PG configured with memory cells is a physical page, and data stored in the physical page may be logical page data. That is, data of a plurality of logical pages may be stored in a single page, and the program state of the memory cells may vary depending on the logical page data.

The first to n-th bit lines BL1 to BLn may be coupled to first to n-th page buffers PB1 to PBn, respectively, which are included in the page buffer group 140.

The first to n-th page buffers PB1 to PBn may simultaneously operate in response to page buffer control signals PBSIG. During a program operation, the first to n-th page buffers PB1 to PBn may apply various voltages to corresponding ones of the first to n-th bit lines BL1 to BLn in response to the page buffer control signals PBSIG. For example, during a program operation, the first to n-th page buffers PB1 to PBn may store the data input from the controller and apply a program permission voltage or a program inhibition voltage to the first to n-th page buffers PB1 to PBn depending on the stored data. The program permission voltage may be 0 V, and the program inhibition voltage may be a supply voltage VCC. Additionally, the first to n-th page buffers PB1 to PBn may apply a program suppression voltage between the program permission voltage and the program inhibition voltage to the selected bit lines in response to the page buffer control signals PBSIG.

During a program verify operation, the first to n-th page buffers PB1 to PBn may store sensing data SDT that is sensed depending on the voltage or current of the first to n-th bit lines BL1 to BLn, and may output the sensing data SDT whenever verify operations are performed in response to the page buffer control signals PBSIG.

Figure 4:
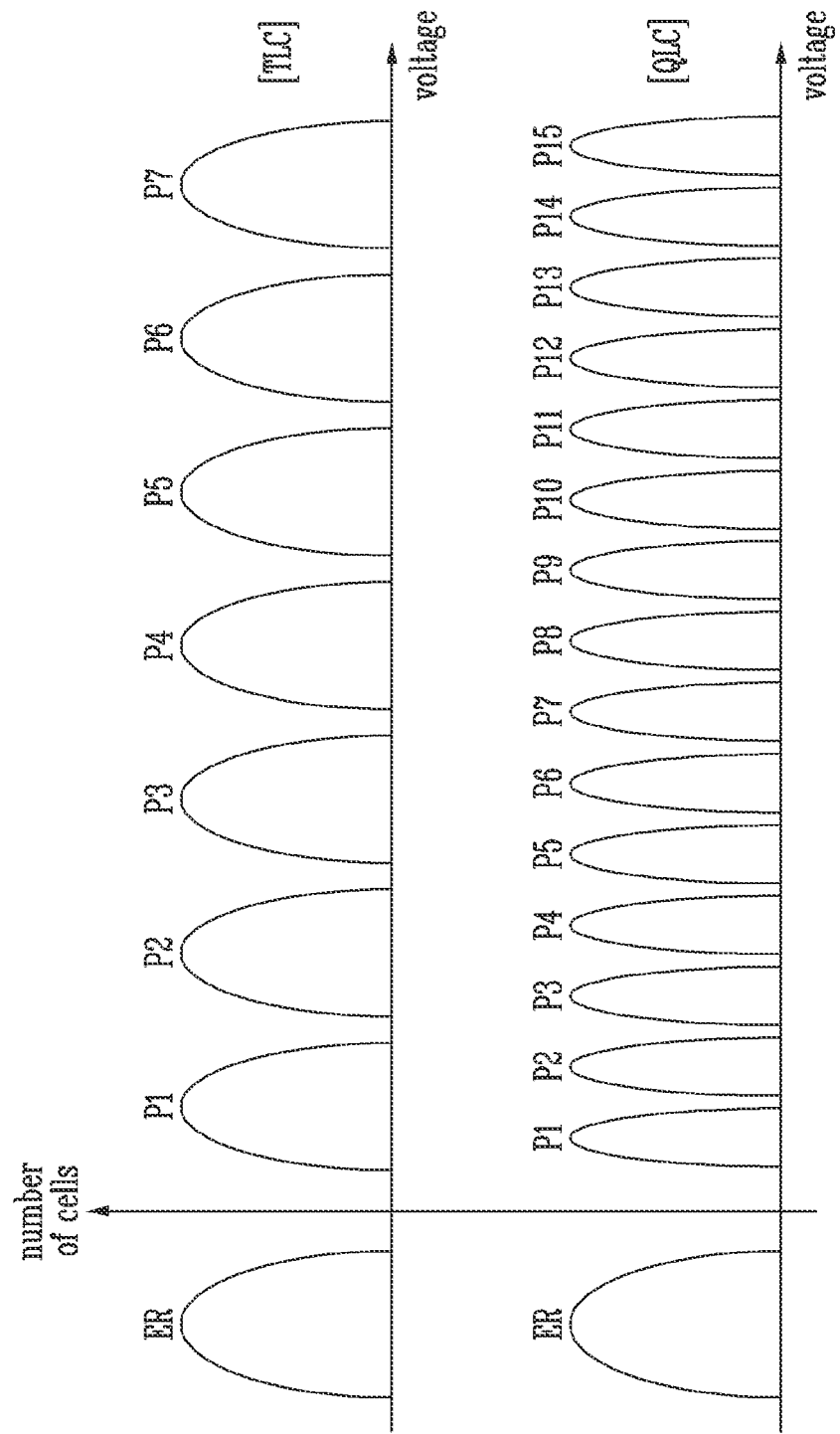
FIG. 4 is a diagram illustrating the threshold voltage distribution of memory cells.

FIG. 4 is a diagram illustrating the threshold voltage distribution of memory cells.

Referring to FIG. 4, a program operation may be classified into various methods depending on the number of bits stored in a memory cell. For example, a method in which 3-bit data is stored in a single memory cell is referred to as a TLC method, and a method in which 4-bit data is stored in a single memory cell is referred to as a QLC method.

In the TLC method, the state of memory cells may be classified as an erased state ER or any one of seven program states P1 to P7. In the QLC method, the state of memory cells may be classified as an erased state ER or any one of 15 program states P1 to P15.

The number of bits that can be stored in a single memory cell may be five or more bits, and the present embodiment is not limited by the number of bits stored in a memory cell.

Because the threshold voltage of memory cells varies within a limited voltage range, as the number of threshold voltage distributions increases, the interval between the threshold voltage distributions corresponding to different states may decrease. As the interval between the threshold voltage distributions is narrower, the number of error bits detected during a read operation may increase.

In the present embodiment, a memory device capable of curbing the expansion of the threshold voltage distribution of memory cells and capable of improving the program operation speed and a method of operating the memory device will be described.

Figure 5:
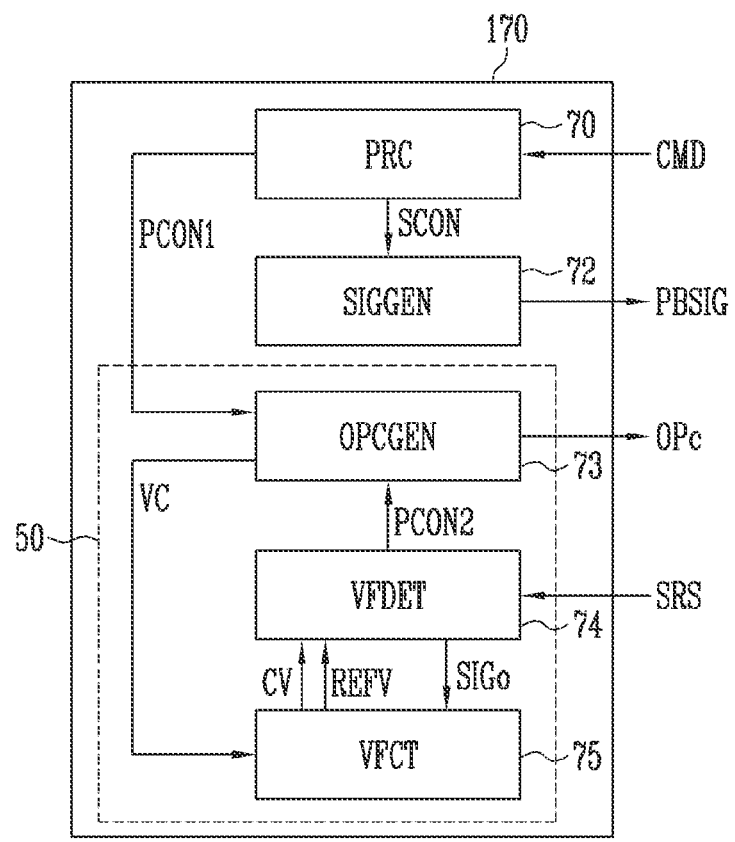
FIG. 5 is a diagram illustrating a control logic circuit according to an embodiment of the present disclosure.

FIG. 5 is a diagram illustrating a control logic circuit according to an embodiment of the present disclosure.

Referring to FIG. 5, the control logic circuit 170 may include a processor 70, a signal generator 72, an operation code generator 73, a verify determiner 74, and a verify counter 75.

The processor 70 may control the signal generator 72 and the operation code generator 73 in response to a received command CMD. For example, when a command CMD for a program operation is input, the processor 70 may generate a first program control code PCON1 and output the same to the operation code generator 73, and may generate a signal control signal SCON and output the same to the signal generator 72. The first program control code PCON1 may be a signal for performing a first program loop, and the signal control signal SCON may be a signal for operating the signal generator 72.

The signal generator 72 may output page buffer control signals PBSIG in response to the signal control signal SCON. The page buffer control signals PBSIG may include a plurality of signals for controlling a plurality of switches included in a page buffer.

The operation code generator 73 may output an operation code OPc in response to a first program control code PCON1 or a second program control code PCON2. For example, the operation code generator 73 may output an operation code OPc for generating a voltage required for a first program loop in response to the first program control code PCON1. Depending on the operation code OPc, the voltage generator (110 in FIG. 2) may generate a program voltage and a verify voltage and output the generated voltages at a set time. From a second program loop, the operation code generator 73 may output the operation code OPc in response to the second program control code PCON2 output from the verify determiner 74. The operation code generator 73 may output a verify code VC, which is generated when it generates an operation code OPc, to the verify counter 75. The verify code VC may be a code for generating a verify voltage. When verify voltages used for different verify operations are generated, different verify codes VC may be generated.

The verify determiner 74 may output an output signal SIGo in response to a sensing result signal SRS, and may output a second program control code PCON2 by comparing a count value CV with a reference value REFV, which are received from the verify counter 75.

The verify counter 75 counts the number of verify operations or the number of verify voltages whenever it receives a verify code VC from the operation code generator 73, thereby storing an accumulated count value CV. Also, the verify counter 75 may store a reference value REFV that is preset at the manufacturing phase of the memory device. The verify counter 75 may output the count value CV and the reference value REFV in response to the output signal SIGo, and may reset the accumulated count value CV to an initial value (e.g., 0) according to an embodiment.

Among the above-described devices, the main devices 50 of the present embodiment will be described below.

Figure 6:
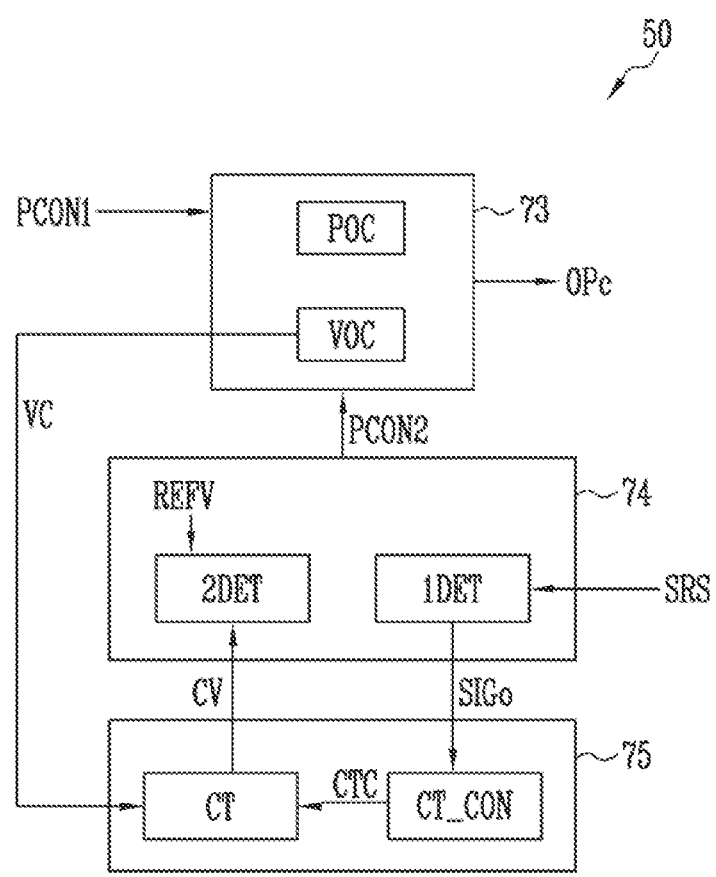
FIG. 6 is a diagram illustrating an operation code generator, a verify determiner, and a verify counter according to an embodiment of the present disclosure.

FIG. 6 is a diagram illustrating an operation code generator, a verify determiner, and a verify counter according to an embodiment of the present disclosure.

Referring to FIG. 6, the operation code generator 73 may include a program operation controller POC and a verify operation controller VOC. The program operation controller POC may output a program code PC in response to a first or second program control code PCON1 or PCON2, and the verify operation controller VOC may output a verify code VC in response to the first or second program control code PCON1 or PCON2. The operation code generator 73 may output an operation code OPc using the program code PC and the verify code VC. For example, the program code PC may include information about the level of a program voltage varying depending on the first or second program control code PCON1 or PCON2, the level of a step voltage, and the time at which the program voltage is output from the voltage generator. The verify code VC may include information about the level of a verify voltage varying depending on the first or second program control code PCON1 or PCON2 and the time at which the verify voltage is output from the voltage generator. Accordingly, the voltage generator (110 in FIG. 2) may generate a program voltage and a verify voltage having levels that are set depending on the operation code OPc as operation voltages Vop, and may selectively output the program voltage or the verify voltage at the time that is set depending on the operation code OPc.

The verify operation controller VOC may output the verify code VC to the verify counter 75 when it outputs the verify code VC in order to generate an operation code OPc.

The verify determiner 74 may include a first determiner 1DET and a second determiner 2DET. The first determiner 1DET may output an output signal SIGo and a program-processing code PPC in response to a sensing result signal SRS. For example, the first determiner 1DET may output an output signal SIGo for outputting a count value CV and a program-processing code PPC for program termination when a sensing result signal SRS corresponding to a pass signal is input, and may output an output signal SIGo for outputting the count value CV and a program-processing code PPC for the next program loop when a sensing result signal SRS corresponding to a fail signal is input.

The second determiner 2DET may compare the count value CV and a reference value REFV with each other and output a verify-processing code VPC depending on the comparison result. The count value CV may be the number of verify operations performed in a selected memory block or a selected page or the number of verify voltages that are used therein. The reference value REFV may be the average number of times the verify operation of normal memory cells passes, and may be acquired through a test operation of the memory device. The reference value REFV may be previously stored in the verify determiner 74 at the manufacturing phase of the memory device, and may vary depending on the memory device.

The second determiner 2DET may include storage for storing the reference value REFV, but the storage for storing the reference value REFV may be separately disposed outside the second determiner 2DET. When the storage in which the reference value REFV is stored is disposed outside the second determiner 2DET, the storage may output the reference value REFV to the second determiner 2DET at the time at which the count value CV is input to the second determiner 2DET. The second determiner 2DET may output different verify-processing codes VPC for the respective cases in which the count value CV is less than the reference value REFV, in which the count value CV is greater than the reference value REFV, and in which the count value CV is equal to the reference value REFV.

The verify determiner 74 may output a second program control code PCON2 using the program-processing code PPC and the verify-processing code VPC.

The verify counter 75 may include a counter controller CT_CON and a counter CT. The counter controller CT_CON may output a counter code CTC in response to an output signal SIGo. For example, in response to the output signal SIGo, the counter controller CT_CON may output a counter code CTC for outputting the count value CV, which is stored in the counter CT, or a counter code CTC for resetting the counter CT.

The counter CT may store the count value CV by counting the number of times a verify operation is performed depending on the verify code VC or the number of verify voltages. In response to the counter code CTC, the counter CT may reset the count value CV to 0 or may output the stored count value CV to the second determiner 2DET.

Figure 7:
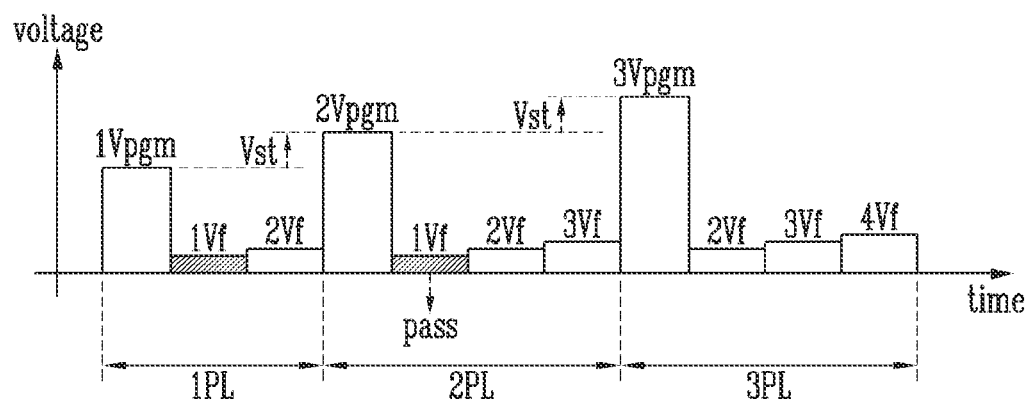
FIG. 7 is a diagram illustrating a program operation of an incremental step pulse program (ISPP) method.

FIG. 7 is a diagram illustrating a program operation of an ISPP method.

Referring to FIG. 7, a program operation of the ISPP method may include a plurality of program loops 1PL, 2PL, 3PL, . . . . A single program loop may include a program voltage application operation and one or more verify operations. For example, a program voltage application operation using a first program voltage 1Vpgm, a first verify operation using a first verify voltage 1Vf, and a second verify operation using a second verify voltage 2Vf may be performed in the first program loop 1PL.

When at least one of the first and second verify operations performed in the first program loop 1PL fails, the second program loop 2PL may be performed. If all of the first and second verify operations of the first program loop 1PL fail, the first and second verify operations are performed also in the second program loop 2PL.

In the second program loop 2PL, a second program voltage 2Vpgm that is a step voltage Vst higher than the first program voltage 1Vpgm may be used, and a third verify operation using a third verify voltage 3Vf may be added. When at least one of the first to third verify operations performed in the second program loop 2PL fails, the third program loop 3PL may be performed. If the first verify operation performed in the second program loop 2PL passes but the second and third verify operations performed therein fail, the first verify operation is not performed in the third program loop 3PL.

In the third program loop 3PL, a program voltage application operation using a third program voltage 3Vpgm that is the step voltage Vst higher than the second program voltage 2Vpgm may be performed, and the second to fourth verify operations using the second to fourth verify voltages 2Vf to 4Vf may be sequentially performed.

Because the program operation of the ISPP method illustrated in FIG. 7 is an example illustrating a normal program operation, the number of program voltage application operations and the number of verify operations are not limited to the numbers illustrated in the drawing. As illustrated in FIG. 7, whenever a program loop is performed, the program voltage is raised by a step voltage Vst having a predetermined level. However, because the memory cells for which the program operation is performed may have different electrical characteristics, the programming speed may also be different in each of the memory cells. For example, there may be memory cells, the threshold voltage of which is relatively quickly raised by the first program voltage 1Vpgm, and memory cells, the threshold voltage of which is relatively slowly raised by the first program voltage 1Vpgm. In this case, there may be differences in the program operation time and in the threshold voltage distribution of the memory cells. The word "predetermined" as used herein with respect to a parameter, such as a predetermined level, predetermined time period, and predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

This will be described with reference to the following drawings.

Figure 8:
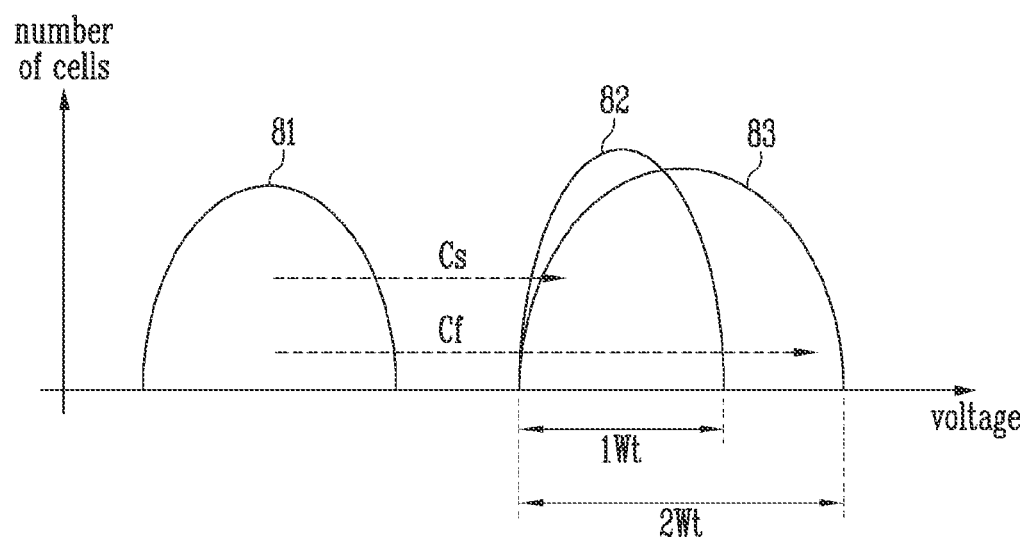
FIG. 8 is a diagram illustrating slow cells and fast cells.

FIG. 8 is a diagram illustrating slow cells and fast cells.

Referring to FIG. 8, memory cells, the threshold voltage of which is quickly raised by the same program voltage, are defined as fast cells Cf, and memory cells, the threshold voltage of which is slowly raised by the same program voltage, are defined as slow cells Cs. In the state 81 in which the slow cells Cs and the fast cells Cf have the same threshold voltage, when a program voltage is applied to a selected word line, the threshold voltage distribution 82 may have a first width 1Wt because the threshold voltage of the slow cells Cs is raised slowly. However, because the threshold voltage of the fast cells Cf is quickly raised, the threshold voltage distribution 83 may have a second width 2Wt that is greater than the first width 1Wt. That is, because the threshold voltage of the fast cells Cf is raised faster than the threshold voltage of the slow cells Cs by the same program voltage, the program operation speed of the fast cells Cf may be higher than the program operation speed of the slow cells Cs. However, because the width 2Wt of the threshold voltage distribution 83 of the fast cells Cf is formed to be greater than the width 1Wt of the threshold voltage distribution 82 of the slow cells Cs, it may be highly possible that the threshold voltage distributions corresponding to different states overlap each other.

In the present embodiment, a program operation is adjusted depending on the number of verify operations performed in a program operation or the number of verify voltages, whereby the program operation speed and the threshold voltage distribution may be improved.

Figure 9:
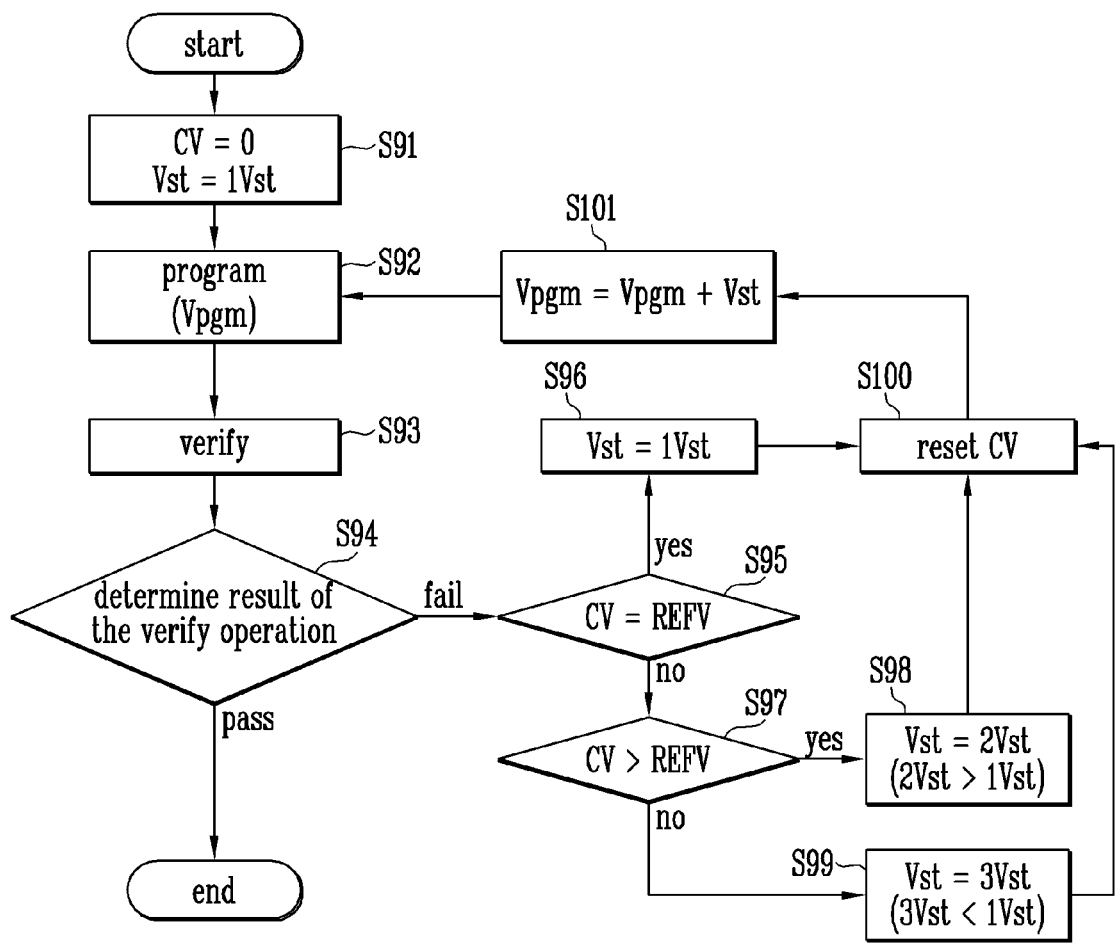
FIG. 9 is a flowchart illustrating a program operation according to a first embodiment of the present disclosure.

FIG. 9 is a flowchart illustrating a program operation according to a first embodiment of the present disclosure.

Referring to FIG. 9, in the first embodiment, a step voltage for a program voltage may be changed depending on the number of verify operations performed in each program loop or in program loops within a predetermined period or on the number of verify voltages.

When the count value of verify operations is greater than a reference value even though the number of program loops increases, this indicates that there are a large number of memory cells, the threshold voltage of which does not reach a target voltage and that slow cells are included in a selected memory block or a selected page. When the number of program loops increases, if the count value of the verify operations is less than the reference value, this indicates that there are a large number of memory cells, the threshold voltage of which reaches the target voltage, and that many fast cells are included in the selected memory block or the selected page. When the number of program loops increases, if the count value of the verify operations is equal to the reference value, this indicates that fast cells or slow cells are not included in the selected memory block or the selected page and normal cells are included therein.

Due to the characteristics of the manufacturing process of memory cells, memory cells included in the same memory block or the same page may have similar electrical characteristics. In this case, all of the memory cells included in the selected memory block or the selected page may have the characteristics of slow cells, the characteristics of fast cells, or the characteristics of normal cells.

Based on the above-described principle, the program operation according to the first embodiment of the present disclosure will be described below.

When a program operation is started, a count value CV may be set to 0, which is an initial value, and a step voltage Vst may be set to a first step voltage 1Vst at step S91. The count value CV may be the number of verify operations or the number of verify voltages that are used, and may be set to the initial value before the program operation is started or when the program operation is started. The first step voltage 1Vst is a voltage set by default, and may be a voltage difference between the program voltages gradually raised in the program operation of the ISPP method.

Subsequently, a first program loop may be performed. In the first program loop, the operation code generator (73 in FIG. 5) may generate an operation code OPc depending on the first program control code PCON1 output from the processor (70 in FIG. 5), and the voltage generator (110 in FIG. 2) may generate a program voltage Vpgm in response to the operation code OPc.

A program voltage application operation configured to apply the program voltage Vpgm generated by the voltage generator 110 to a selected word line may be performed at step S92. The program voltage Vpgm may be applied to the selected word line, and a pass voltage may be applied to the remaining unselected word lines. The program voltage Vpgm may be a voltage for raising the threshold voltage of memory cells, and the pass voltage may be a voltage for forming a channel in a string by turning on the memory cells.

After the program voltage Vpgm is applied to the selected word line for a predetermined time period, a verify operation of the memory cells coupled to the selected word line, that is, a verify operation of the selected page, may be performed at step S93. During the verify operation, a verify voltage may be applied to the selected word line, and the pass voltage may be applied to the unselected word lines. When the verify operation is performed once, the count value CV may increase by 1. Therefore, the count value CV may be 1. When a plurality of verify operations are performed at step S93, the count value CV may increase by the number of verify operations that are performed.

The verify determiner (74 in FIG. 6) may determine whether the result of the verify operation is a pass or a fail. For example, when a sensing result signal (SRS in FIG. 6) is a signal corresponding to a pass, the program operation of the selected page may be terminated. However, when the sensing result signal SRS is a signal corresponding to a fail, the verify determiner 74 may compare the count value CV with a reference value REFV.

For example, the verify determiner 74 may determine at step S95 whether the count value CV is equal to the reference value REFV. When the count value CV is equal to the reference value REFV (yes at step S95), the step voltage Vst is maintained at the first step voltage 1Vst at step S96 and the count value CV may be reset to 0 at step S100.

When the count value CV is different from the reference value REFV (no at step S95), the verify determiner 74 may determine at step S97 whether the count value CV is greater than the reference value REFV. When the count value CV is greater than the reference value REFV (yes), the step voltage Vst may be set to a second step voltage 2Vst that is higher than the first step voltage 1Vst at step S98. That is, when the count value CV is greater than the reference value REFV, this indicates that the selected page includes slow cells, the threshold voltage of which does not reach the target voltage. Therefore, the step voltage Vst may be set to the higher second step voltage 2Vst in order to quickly raise the threshold voltage of the slow cells.

When the count value CV is not greater than the reference value REFV (no at step S97), the step voltage Vst may be set to a third step voltage 3Vst that is lower than the first step voltage 1Vst at step S99. That is, when the count value CV is less than the reference value REFV, this indicates that the memory cells included in the selected page include fast cells. Therefore, in order to slowly raise the threshold voltage of the fast cells, the step voltage Vst may be set to the lower third step voltage 3Vst. Here, all of the first to third step voltages 1Vst to 3Vst are positive voltages higher than 0 V.

When the step voltage Vst is set at step S98 or S99, the count value CV may be reset to 0 at step S100.

When the count value CV is reset at step S100, the program voltage Vpgm may be set to a voltage that is the step voltage Vst higher than the previous program voltage Vpgm at step S101. Here, the step voltage Vst may be the voltage set at step S96, S98 or S99. From the second program loop, the program voltage Vpgm is changed depending on the result of the verify operation of the previous program loop. Accordingly, the operation code generator (73 in FIG. 6) may generate an operation code OPc depending on the second program control code PCON2 output from the verify determiner (74 in FIG. 6).

Subsequently, a program voltage application operation may be performed at step S92 using the program voltage Vpgm set at step S101.

According to the above-described process, steps S92 to S101 may be repeatedly performed until the verify operation passes at step S94.

When the program operation is performed according to the first embodiment, the case in which normal cells are included in the selected page, the case in which slow cells are included in the selected page, and the case in which fast cells are included in the selected page will be described below.

Figure 10:
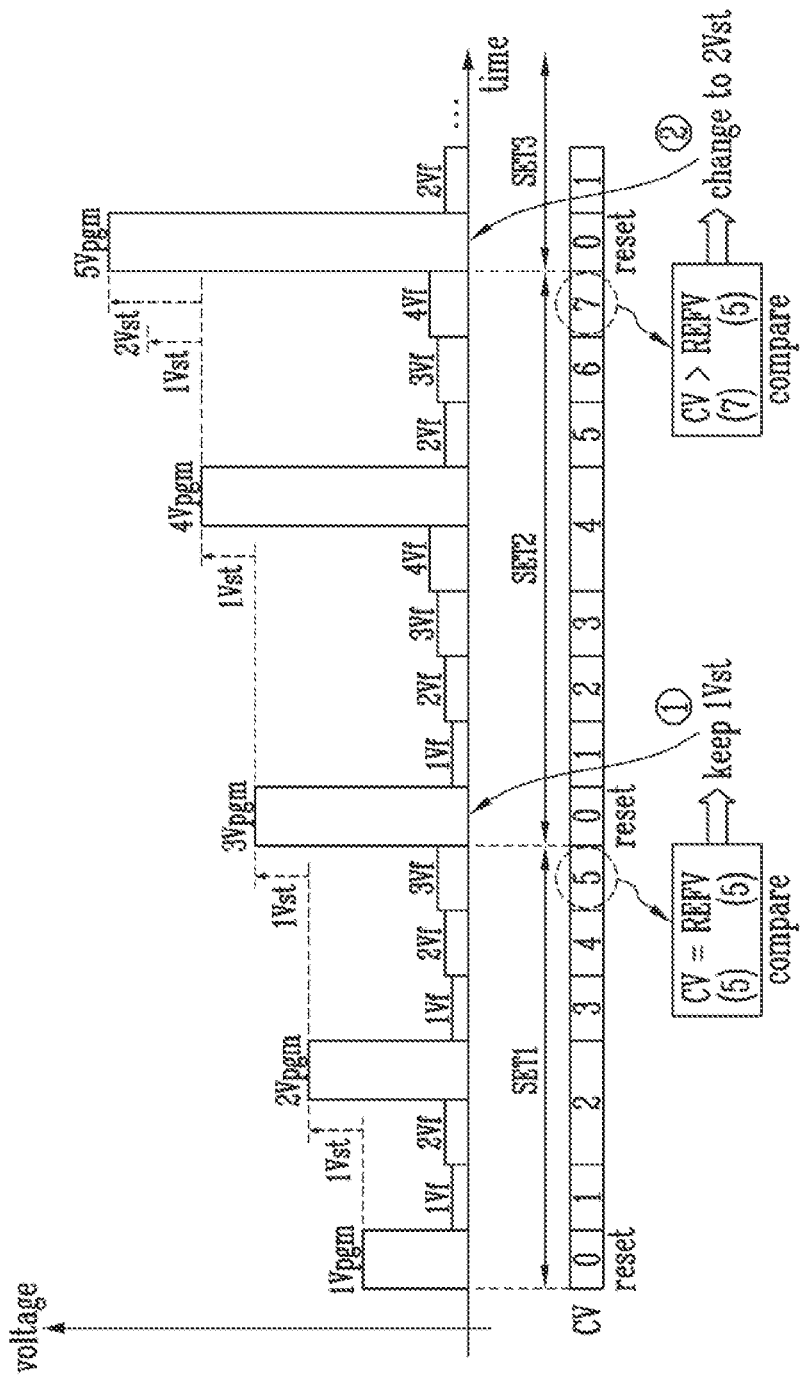
FIG. 10 is a diagram illustrating a program operation when a count value is greater than a reference value in the first embodiment.

FIG. 10 is a diagram illustrating a program operation when the count value is greater than the reference value in the first embodiment.

Referring to FIG. 10, a plurality of program loops may be grouped into a plurality of sets having a preset number of program loops in the present embodiment. The count value CV may be reset whenever the program loop is changed, as described with reference to FIG. 9, or may be reset whenever the set is changed. The meaning that the program loop is changed may be that the program voltage used for a program voltage application operation is changed. In FIG. 10, the embodiment in which the count value CV is reset whenever the set is changed. For example, a first set SET1 may include first and second program loops, and a second set SET2 may include third and fourth program loops. In FIG. 10, an example in which two program loops are included in a single set is illustrated, but this is merely an embodiment for helping understanding of a description. Therefore, the number of program loops included in a single set may be changed depending on the memory device.

When the first program loop is started, a first program voltage 1Vpgm may be applied to the selected word line. Because a verify operation is not yet performed, the count value CV is 0.

A first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the first and second verify operations are determined to fail, the second program loop for the next program operation may be performed.

The second program voltage 2Vpgm used in the second program loop may be a voltage that is the first step voltage 1Vst higher than the first program voltage 1Vpgm. The first step voltage 1Vst may be a step voltage that is set by default. Because the count value CV is determined for each set in FIG. 10, the count value CV is not determined after the first program loop is terminated. Accordingly, the second program voltage 2Vpgm that is the first step voltage 1Vst higher than the first program voltage 1Vpgm may be used in the second program loop. When the program operation using the second program voltage 2Vpgm is performed, the count value is maintained at 2.

In the second program loop, the first verify operation using the first verify voltage 1Vf may be performed. When the first verify operation is performed, the count value CV becomes 3. Then, the second verify operation using the second verify voltage 2Vf may be performed. When the second verify operation is performed, the count value CV becomes 4. Then, a third verify operation using a third verify voltage 3Vf may be performed. When the third verify operation is performed, the count value CV becomes 5. When the second program loop is set to perform up to the third verify operation, the count value CV may be compared with the reference value REFV after the third verify operation is performed. When the reference value REFV is set to 5 and when the count value CV is 5, because the count value CV is equal to the reference value REFV, the first step voltage 1Vst may be maintained (ⓒ). This indicates that the characteristics of slow cells or fast cells do not appear in the selected page until the first set SET1.

When the third program loop of the second set SET2 is started, the count value CV is reset to 0, and a third program voltage 3Vpgm, which is the first step voltage 1Vst higher than the second program voltage 2Vpgm, may be applied to the selected word line.

In the third program loop, the first verify operation using the first verify voltage 1Vf may be performed. When the first verify operation is performed, the count value CV becomes 1. Then, when the second verify operation using the second verify voltage 2Vf is performed, the count value CV becomes 2. When the third and fourth verify operations respectively using the third and fourth verify voltages 3Vf and 4Vf are sequentially performed, the count value CV becomes 4.

When the third program loop is set so as to perform up to the fourth verify operation, whether all of the first to fourth verify operations pass may be determined after the fourth verify operation is performed. When the first verify operation passes and when the second to fourth verify operations are determined to fail, the fourth program loop may be performed.

When the fourth program voltage 4Vpgm used in the fourth program loop is set, because the first step voltage 1Vst is maintained, the fourth program voltage 4Vpgm may be set to a voltage that is the first step voltage 1Vst higher than the third program voltage 3Vpgm.

After the fourth program voltage 4Vpgm is applied to the selected word line for a predetermined time period, the second to fourth verify operations respectively using the second to fourth verify voltages 2Vf to 4Vf may be sequentially performed. Because the first verify operation passes in the third program loop, the first verify operation is not performed in the fourth program loop.

When the second to fourth verify operations are performed in the fourth program loop, the count value CV becomes 7.

After the fourth verify operation is performed, the count value CV may be compared with the reference value REFV. Because the count values CV is 7 in the fourth program loop, the count value CV is greater than the reference value REFV. Accordingly, the step voltage Vst may be set to the higher second step voltage 2Vst (②).

This indicates that the characteristics of slow cells appear in the selected page in the second set SET2. Therefore, a fifth program voltage 5Vpgm that is the second step voltage 2Vst higher than the fourth program voltage 4Vpgm may be used from the third set SET3.

Figure 11:
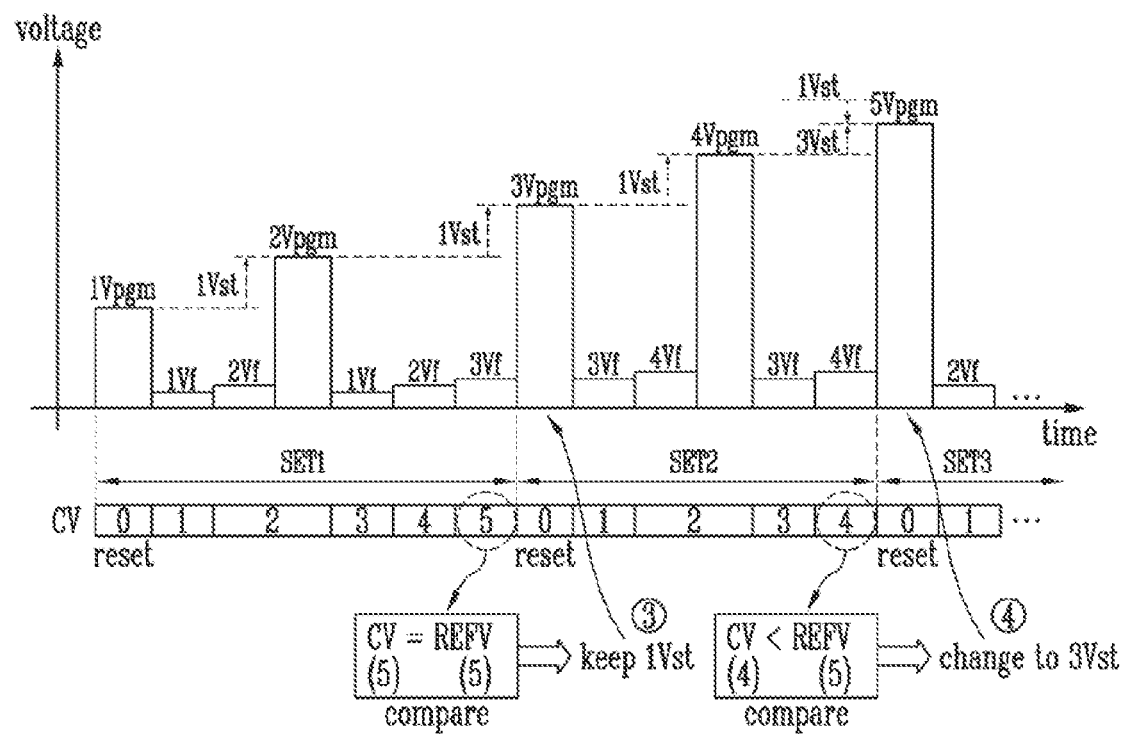
FIG. 11 is a diagram illustrating a program operation when a count value is less than a reference value in the first embodiment.

FIG. 11 is a diagram illustrating a program operation when the count value is less than the reference value according to the first embodiment.

Referring to FIG. 11, a plurality of program loops may be grouped into a plurality of sets having a preset number of program loops in the present embodiment. The count value CV may be reset whenever the program loop is changed, as described with reference to FIG. 9, or may be reset whenever the set is changed. In FIG. 11, the embodiment in which the count value CV is reset whenever the set is changed is illustrated. For example, a first set SET1 may include first and second program loops, and a second set SET2 may include third and fourth program loops. In FIG. 11, an example in which two program loops are included in a single set is illustrated, but this is merely an embodiment for helping understanding of a description. Therefore, the number of program loops included in a single set may be changed depending on the memory device.

When the first program loop is started, a first program voltage 1Vpgm may be applied to the selected word line. Because a verify operation is not yet performed, the count value CV is 0.

A first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the first and second verify operations are determined to fail, the second program loop for the next program operation may be performed.

The second program voltage 2Vpgm used in the second program loop may be a voltage that is the first step voltage 1Vst higher than the first program voltage 1Vpgm. The first step voltage 1Vst may be a step voltage set by default. Because the count value CV is determined for each set in FIG. 11, the count value CV is not determined after the first program loop is terminated. Accordingly, the second program voltage 2Vpgm that is the first step voltage 1Vst higher than the first program voltage 1Vpgm may be used in the second program loop. When the program operation using the second program voltage 2Vpgm is performed, the count value is maintained at 2.

In the second program loop, the first verify operation using the first verify voltage 1Vf may be performed. When the first verify operation is performed, the count value CV becomes 3. Then, the second verify operation using the second verify voltage 2Vf may be performed. When the second verify operation is performed, the count value CV becomes 4. Then, a third verify operation using a third verify voltage 3Vf may be performed. When the third verify operation is performed, the count value CV becomes 5. When the second program loop is set to perform up to the third verify operation, the count value CV may be compared with the reference value REFV after the third verify operation is performed. When the reference value REFV is set to 5 and when the count value CV is 5, because the count value CV is equal to the reference value REFV, the first step voltage 1Vst may be maintained (@). This indicates that the characteristics of slow cells or fast cells do not appear in the selected page until the first set SET1.

When the third program loop of the second set SET2 is started, the count value CV is reset to 0, and a third program voltage 3Vpgm that is the first step voltage 1Vst higher than the second program voltage 2Vpgm may be applied to the selected word line.

When the first and second verify operations performed in the second program loop pass, the third and fourth verify operations respectively using the third and fourth verify voltages 3Vf and 4Vf may be sequentially performed in the third program loop, and the count value CV becomes 2 because the two verify operations are performed.

When the third program loop is set to perform up to the fourth verify operation, whether all of the third and fourth verify operations pass may be determined after the fourth verify operation is performed. When all of the third and fourth verify operations are determined to fail, the fourth program loop may be performed.

When the fourth program voltage 4Vpgm used in the fourth program loop is set, because the first step voltage 1Vst is maintained, the fourth program voltage 4Vpgm may be set to a voltage that is the first step voltage 1Vst higher than the third program voltage 3Vpgm.

After the fourth program voltage 4Vpgm is applied to the selected word line for a predetermined time period, the third and fourth verify operations respectively using the third and fourth verify voltages 3Vf and 4Vf may be sequentially performed.

When the third and fourth verify operations are performed in the fourth program loop, the count value CV becomes 4.

After the fourth verify operation is performed, the count value CV may be compared with the reference value REFV. Because the count value CV is 4 in the fourth program loop, the count value CV is determined to be less than the reference value REFV, and the step voltage Vst may be set to the third step voltage 3Vst that is lower than the first step voltage 1Vst (®).

Because this indicates that the characteristics of fast cells appear in the selected page during the first and second sets SET1 and SET2, a fifth program voltage 5Vpgm that is the third step voltage 3Vst higher than the fourth program voltage 4Vpgm may be used from a third set SET3 in order to prevent the interval between the threshold voltage distributions from increasing.

Figure 12:
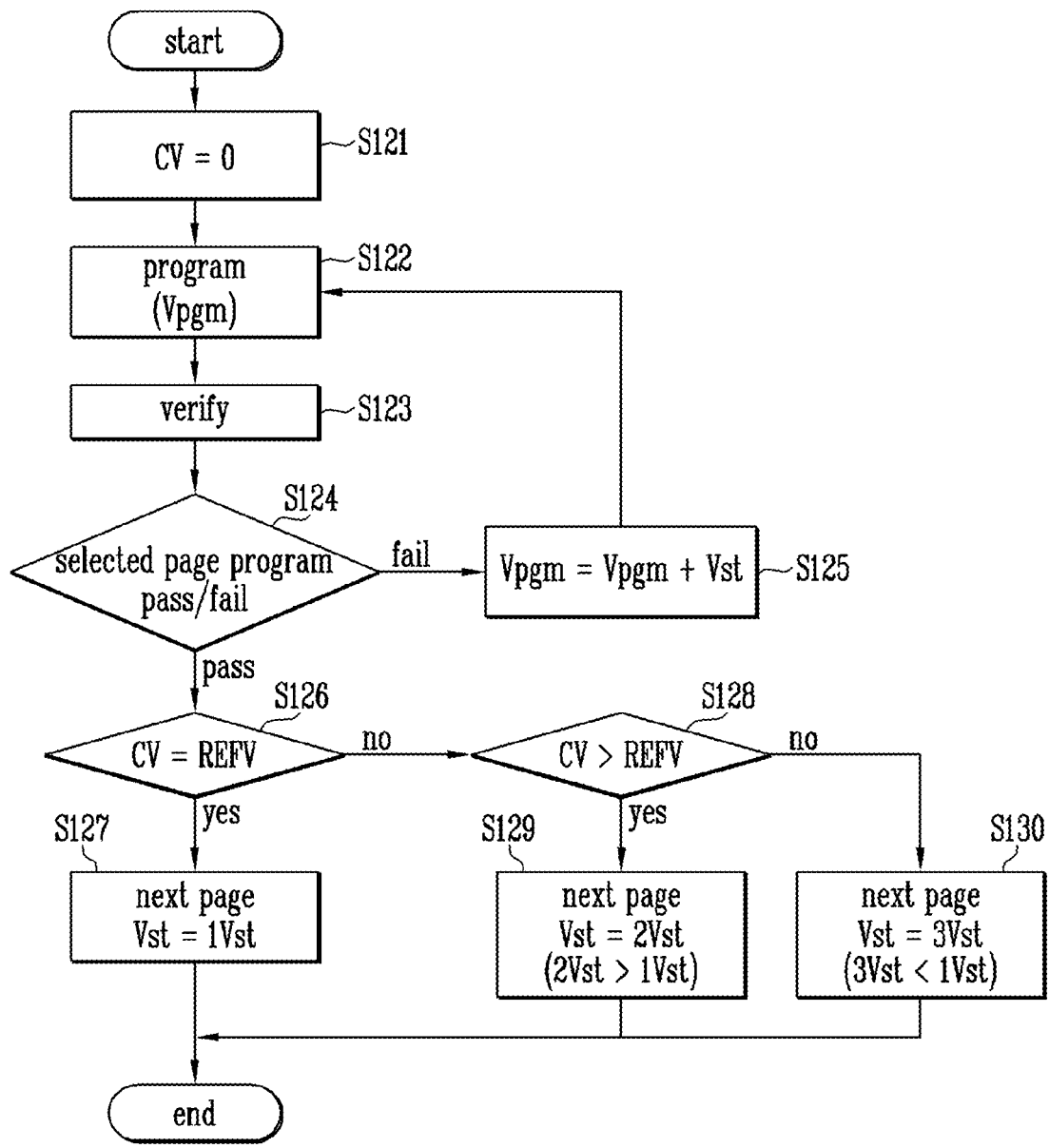
FIG. 12 is a flowchart illustrating a program operation according to a second embodiment of the present disclosure.

FIG. 12 is a flowchart illustrating a program operation according to a second embodiment of the present disclosure.

Referring to FIG. 12, in the second embodiment, the count value CV may continuously increase until the program operation of a selected page is completed. For example, the first embodiment is configured such that the count value CV is reset whenever a specific program loop or a set is started, but the second embodiment is configured such that the count value CV is not reset until the program operation of the selected page is completed. In the second embodiment, the count value CV at the time of termination of the program operation of the selected page is compared with a reference value, and a step voltage Vst for the next selected page may be set depending on the comparison result.

The program operation according to the second embodiment of the present disclosure will be described below.

When the program operation is started, the count value CV may be set to 0, which is an initial value, at step S121. The step voltage Vst may be maintained at the voltage set in the previous page, and the step voltage Vst may be set to a first step voltage 1Vst, which is a default voltage, when the first page is the selected page.

The count value CV may be the number of verify operations or the number of verify voltages that are used, and may be set to the initial value before the program operation is started or when the program operation is started.

Subsequently, a first program loop may be performed. In the first program loop, the operation code generator (73 in FIG. 5) may generate an operation code OPc depending on the first program control code PCON1 output from the processor (70 in FIG. 5), and the voltage generator (110 in FIG. 2) may generate a program voltage Vpgm in response to the operation code OPc.

A program voltage application operation configured to apply the program voltage Vpgm generated by the voltage generator 110 to a selected word line may be performed at step S122. The program voltage Vpgm may be applied to the selected word line, and a pass voltage may be applied to the remaining unselected word lines. The program voltage Vpgm may be a voltage for raising the threshold voltage of memory cells, and the pass voltage may be a voltage for forming a channel in a string by turning on the memory cells.

After the program voltage Vpgm is applied to the selected word line for a predetermined time period, a verify operation of the memory cells coupled to the selected word line, that is, a verify operation of the selected page, may be performed at step S123. During the verify operation, a verify voltage may be applied to the selected word line, and the pass voltage may be applied to the unselected word lines. When the verify operation is performed once, the count value CV may increase by 1. Therefore, the count value CV may become 1. When a plurality of verify operations are performed at step S123, the count value CV may increase by the number of verify operations that are performed.

Subsequently, determining whether the verify operation or all of the plurality of verify operations performed at step S123 passes or pass may be performed at step S124. When it is determined at step S124 that at least one of the verify operation fails, the program voltage Vpgm may be set to be raised by the step voltage Vst at step S125 in order to perform the next program loop.

In the second embodiment, because the step voltage Vst is not changed during the program operation of the selected page, the step voltage Vst that is initially set may be continuously used. When the program voltage Vpgm is newly set to be raised by the step voltage Vst at step S125, the next program loop may be performed at step S122 using the newly set program voltage Vpgm. In this way, steps S122 to S125 may be repeatedly performed until the determination result is a pass at step S124.

When it is determined at step S124 that the verify operation or all of the plurality of verify operations of the selected page passes or pass, the verify determiner (74 in FIG. 6) may compare the count value CV with the reference value REFV.

The verify determiner 74 may determine at step S126 whether the count value CV is equal to the reference value REFV. When the count value CV is equal to the reference value REFV (yes), the step voltage Vst may be maintained at the first step voltage 1Vst at step S127.

When the count value CV is different from the reference value REFV (no at step S126), the verify determiner 74 may determine at step S128 whether the count value CV is greater than the reference value REFV. When the count value CV is greater than the reference value REFV (yes), the step voltage Vst may be set to a second step voltage 2Vst that is higher than the first step voltage 1Vst at step S129. That is, when the count value CV is greater than the reference value REFV, this indicates that slow cells, the threshold voltage of which does not reach the target voltage, are included in the selected page. Accordingly, the step voltage Vst may be set to the higher second step voltage 2Vst in order to quickly raise the threshold voltage of the slow cells.

When the count value CV is not greater than the reference value REFV (no at step S128), the step voltage Vst may be set to a third step voltage 3Vst that is lower than the first step voltage 1Vst at step S130. Because step S128 is performed only when it is determined at step S126 that the count value CV is not equal to the reference value REFV, when it is determined at step S128 that the count value CV is not greater than the reference value REFV, the case in which the count value CV is equal to the reference value REFV is excluded therefrom.

When the count value CV is less than the reference value REFV, this indicates that the memory cells included in the selected page include fast cells. Therefore, the step voltage Vst may be set to the third step voltage 3Vst that is lower than the first step voltage 1Vst in order to slowly raise the threshold voltage of the fast cells. Here, all of the first to third step voltages 1Vst to 3Vst are positive voltages higher than 0 V.

When the step voltage Vst is set at step S127, S129 or S130, the program operation of the selected page is terminated, and the step voltage Vst set at step S127, S129 or S130 may be set as a default step voltage in the program operation of the next page.

When the program operation according to the second embodiment is performed, the respective cases in which normal cells are included in the selected page, in which slow cells are included therein, and in which fast cells are included therein will be described below.

Figure 13:
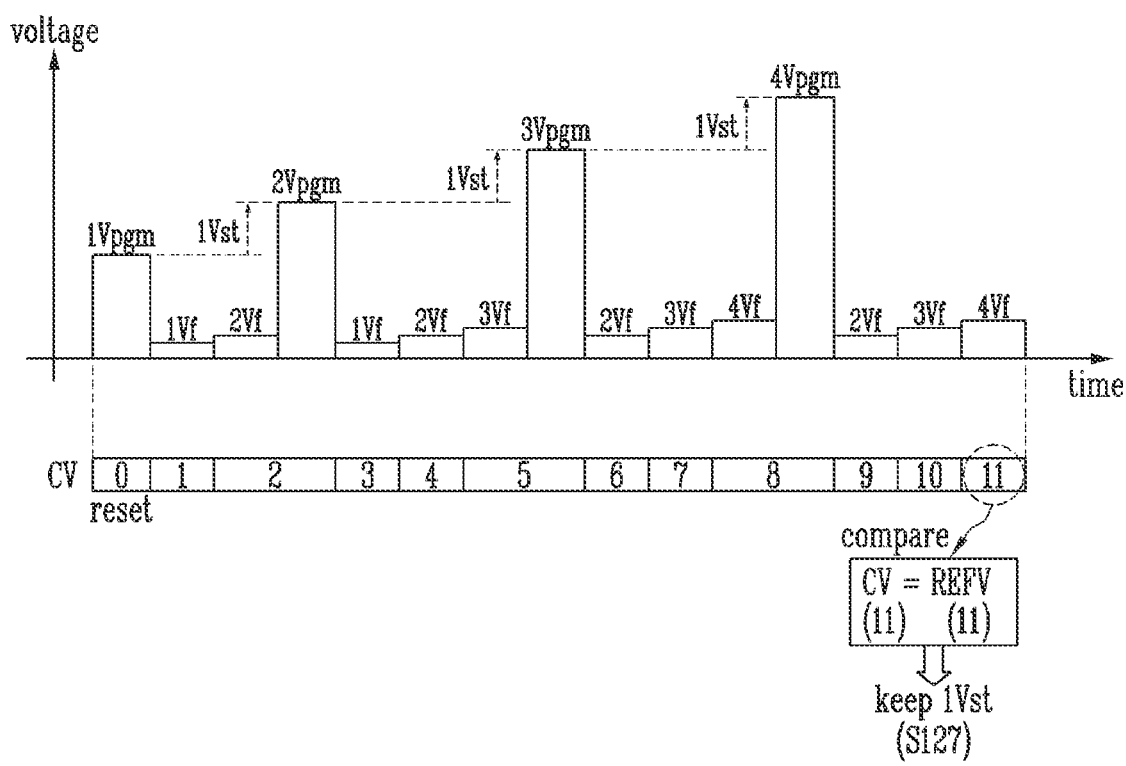
FIG. 13 is a diagram illustrating a program operation when a count value is equal to a reference value in the second embodiment.

FIG. 13 is a diagram illustrating a program operation when the count value is equal to the reference value in the second embodiment.

Referring to FIG. 13, the first program loop may be performed in the state in which the first step voltage 1Vst is set as a default voltage and in which the count value CV is reset to 0.

When the first program loop is started, a first program voltage 1Vpgm may be applied to the selected word line. Here, because a verify operation is not yet performed, the count value CV is 0.

After the first program voltage 1Vpgm is applied to the selected word line for a predetermined time period, a first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the first and second verify operations are determined to fail, a second program loop for the next program operation may be performed.

The second program voltage 2Vpgm used in the second program loop may be a voltage that is the first step voltage 1Vst higher than the first program voltage 1Vpgm. When the second program voltage 2Vpgm is applied to the selected word line, the count value CV is maintained at 2, which is the previous value.

After the second program voltage 2Vpgm is applied to the selected word line for a predetermined time period, the first verify operation using the first verify voltage 1Vf may be performed. When the first verify operation is performed, the count value CV becomes 3. In this way, the second and third verify operations respectively using the second and third verify voltages 2Vf and 3Vf may be sequentially performed. Because the two verify operations (the second and third verify operations) are performed after the first verify operation in the second program loop, the count value CV becomes 5.

When at least one of the first to third verify operations performed in the second program loop fails, a third program loop may be performed. For example, when the first verify operation passes and the second and third verify operations fail, among the first to third verify operations performed in the second program loop, the third program loop may be performed, and the first verify operation is not performed from the third program loop.

When the third program loop is started, a third program voltage 3Vpgm that is the first step voltage 1Vst higher than the second program voltage 2Vpgm may be applied to the selected word line. Then, the second to fourth verify operations using the second to fourth verify voltages 2Vf to 4Vf may be sequentially performed. Because the three verify operations (the second to fourth verify operations) are performed in the third program loop, the count value CV becomes 8.

When at least one of the second to fourth verify operations performed in the third program loop fails, a fourth program loop may be performed. For example, when all of the second to fourth verify operations performed in the third program loop fail, the fourth program loop may be performed.

When the fourth program loop is started, a fourth program voltage 4Vpgm that is the first step voltage 1Vst higher than the third program voltage 3Vpgm may be applied to the selected word line. Then, the second to fourth verify operations using the second to fourth verify voltages 2Vf to 4Vf may be sequentially performed. Because the three verify operations (the second to fourth verify operations) are performed in the fourth program loop, the count value CV becomes 11.

When all of the second to fourth verify operations performed in the fourth program loop pass, the program operation of the selected page may be terminated. Here, the count value CV may be compared with the reference value REFV. When the count value CV is equal to the reference value REFV (S127 in FIG. 12), the first step voltage 1Vst is maintained, and the maintained first step voltage 1Vst may be used as the step voltage Vst in the program operation of the next page.

That is, when the count value CV is equal to the reference value REFV, this indicates that memory cells included in the selected page are normal cells. Therefore, the step voltage Vst may be maintained at the first step voltage 1Vst, which is a default voltage.

Figure 14:
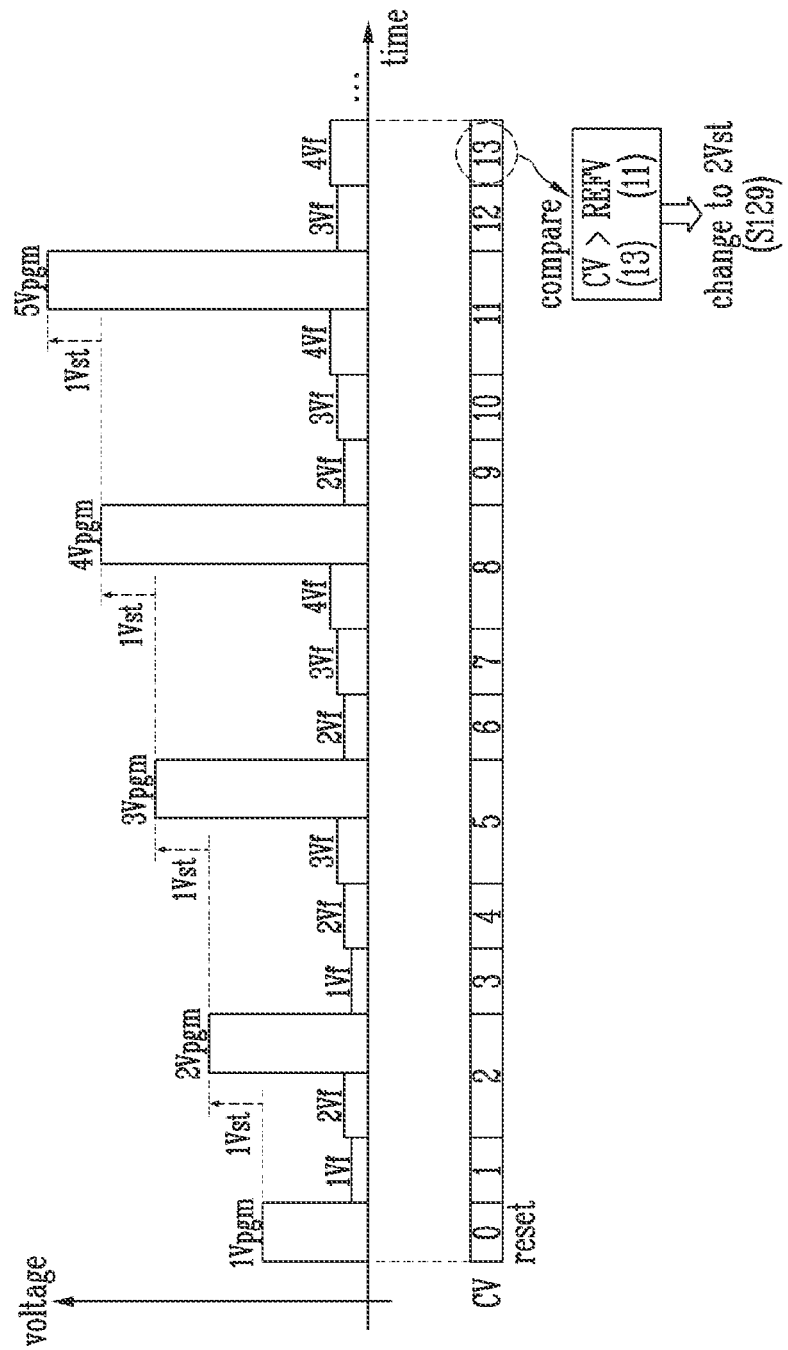
FIG. 14 is a diagram illustrating a program operation when a count value is greater than a reference value in the second embodiment.

FIG. 14 is a diagram illustrating a program operation when the count value is greater than the reference value in the second embodiment.

Referring to FIG. 14, the first program loop may be performed in the state in which the first step voltage 1Vst is set as a default voltage and in which the count value CV is reset to 0.

When the first program loop is started, a first program voltage 1Vpgm may be applied to the selected word line. Here, because a verify operation is not yet performed, the count value CV is 0.

After the first program voltage 1Vpgm is applied to the selected word line for a predetermined time period, a first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the first and second verify operations are determined to fail, a second program loop for the next program operation may be performed.

The second program voltage 2Vpgm used in the second program loop may be a voltage that is the first step voltage 1Vst higher than the first program voltage 1Vpgm. When the second program voltage 2Vpgm is applied to the selected word line, the count value CV is maintained at 2, which is the previous value.

After the second program voltage 2Vpgm is applied to the selected word line for a predetermined time period, the first verify operation using the first verify voltage 1Vf may be performed. When the first verify operation is performed, the count value CV becomes 3. In this way, the second and third verify operations respectively using the second and third verify voltages 2Vf and 3Vf may be sequentially performed. Because the two verify operations (the second and third verify operations) are performed after the first verify operation in the second program loop, the count value CV becomes 5.

When at least one of the first to third verify operations performed in the second program loop fails, a third program loop may be performed. For example, when the first verify operation passes and the second and third verify operations fail, among the first to third verify operations performed in the second program loop, the third program loop may be performed, and the first verify operation is not performed from the third program loop.

When the third program loop is started, a third program voltage 3Vpgm that is the first step voltage 1Vst higher than the second program voltage 2Vpgm may be applied to the selected word line. Then, the second to fourth verify operations using the second to fourth verify voltages 2Vf to 4Vf may be sequentially performed. Because the three verify operations (the second to fourth verify operations) are performed in the third program loop, the count value CV becomes 8.

When at least one of the second to fourth verify operations performed in the third program loop fails, a fourth program loop may be performed. For example, when all of the second to fourth verify operations performed in the third program loop fail, the fourth program loop may be performed.

When the fourth program loop is started, a fourth program voltage 4Vpgm that is the first step voltage 1Vst higher than the third program voltage 3Vpgm may be applied to the selected word line. Then, the second to fourth verify operations using the second to fourth verify voltages 2Vf to 4Vf may be sequentially performed. Because the three verify operations (the second to fourth verify operations) are performed in the fourth program loop, the count value CV becomes 11.

When at least one of the second to fourth verify operations performed in the fourth program loop fails, a fifth program loop may be performed. For example, when the second verify operation passes and the third and fourth verify operations fail, among the second to fourth verify operations performed in the fourth program loop, the fifth program loop may be performed, and the second verify operation is not performed from the fifth program loop.

When the fifth program loop is started, a fifth program voltage 5Vpgm that is the first step voltage 1Vst higher than the fourth program voltage 4Vpgm may be applied to the selected word line. Then, the third and fourth verify operations using the third and fourth verify voltages 3Vf and 4Vf may be sequentially performed. Because the two verify operations (the third and fourth verify operations) are performed in the fifth program loop, the count value CV becomes 13.

When all of the third and fourth verify operations performed in the fifth program loop pass, the program operation of the selected page may be terminated.

When the program operation of the selected page is terminated, the count value CV may be compared with the reference value REFV. When the count value CV is greater than the reference value REFV as the comparison result (S129 in FIG. 12), the step voltage Vst is changed to the second step voltage 2Vst that is higher than the first step voltage 1Vst, and the second step voltage 2Vst may be used as the step voltage Vst in the program operation of the next page.

That is, when the count value CV is greater than the reference value REFV, this indicates that the memory cells included in the selected page include slow cells. Therefore, the program operation speed may be improved by raising the step voltage Vst.

Figure 15:
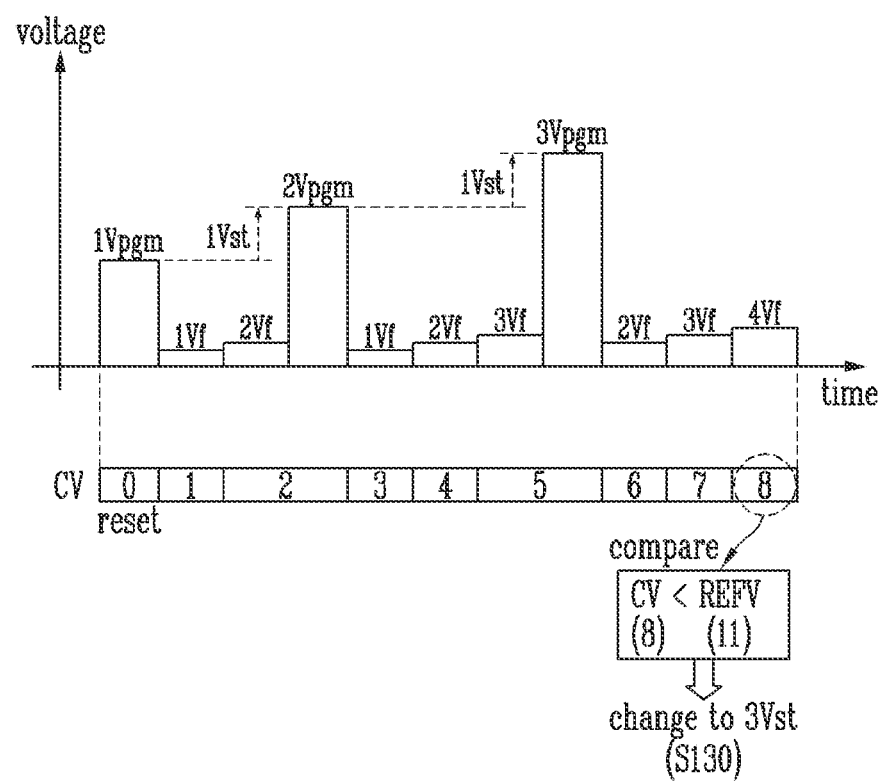
FIG. 15 is a diagram illustrating a program operation when a count value is less than a reference value in the second embodiment.

FIG. 15 is a diagram illustrating a program operation when the count value is less than the reference value in the second embodiment.

Referring to FIG. 15, the first program loop may be performed in the state in which the first step voltage 1Vst is set as a default voltage and in which the count value CV is reset to 0.

When the first program loop is started, a first program voltage 1Vpgm may be applied to the selected word line. Here, because a verify operation is not yet performed, the count value CV is 0.

After the first program voltage 1Vpgm is applied to the selected word line for a predetermined time period, a first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the first and second verify operations are determined to fail, a second program loop for the next program operation may be performed.

The second program voltage 2Vpgm used in the second program loop may be a voltage that is the first step voltage 1Vst higher than the first program voltage 1Vpgm. When the second program voltage 2Vpgm is applied to the selected word line, the count value CV is maintained at 2, which is the previous value.

After the second program voltage 2Vpgm is applied to the selected word line for a predetermined time period, the first verify operation using the first verify voltage 1Vf may be performed. When the first verify operation is performed, the count value CV becomes 3. In this way, the second and third verify operations respectively using the second and third verify voltages 2Vf and 3Vf may be sequentially performed. Because the two verify operations (the second and third verify operations) are performed after the first verify operation in the second program loop, the count value CV becomes 5.

When at least one of the first to third verify operations performed in the second program loop fails, a third program loop may be performed. For example, when the first verify operation passes and the second and third verify operations fail, among the first to third verify operations performed in the second program loop, the third program loop may be performed, and the first verify operation is not performed from the third program loop.

When the third program loop is started, a third program loop 3Vpgm that is the first step voltage 1Vst higher than the second program voltage 2Vpgm may be applied to the selected word line. Then, the second to fourth verify operations using the second to fourth verify voltages 2Vf to 4Vf may be sequentially performed. Because the three verify operations (the second to fourth verify operations) are performed in the third program loop, the count value CV becomes 8.

When all of the second to fourth verify operations performed in the third program loop pass, the program operation of the selected page may be terminated.

When the program operation of the selected page is terminated, the count value CV may be compared with the reference value REFV. When the count value CV is less than the reference value REFV as the comparison result (S130 in FIG. 12), the step voltage Vst is changed to the third step voltage 3Vst that is lower than the first step voltage 1Vst, and the third step voltage 3Vst may be used as the step voltage Vst in the program operation of the next page.

That is, when the count value CV is less than the reference value REFV, this indicates that the selected page includes no slow cells but fast cells. Therefore, the step voltage Vst is lowered, whereby the interval between the threshold voltage distributions of memory cells may be prevented from increasing.

Figure 16:
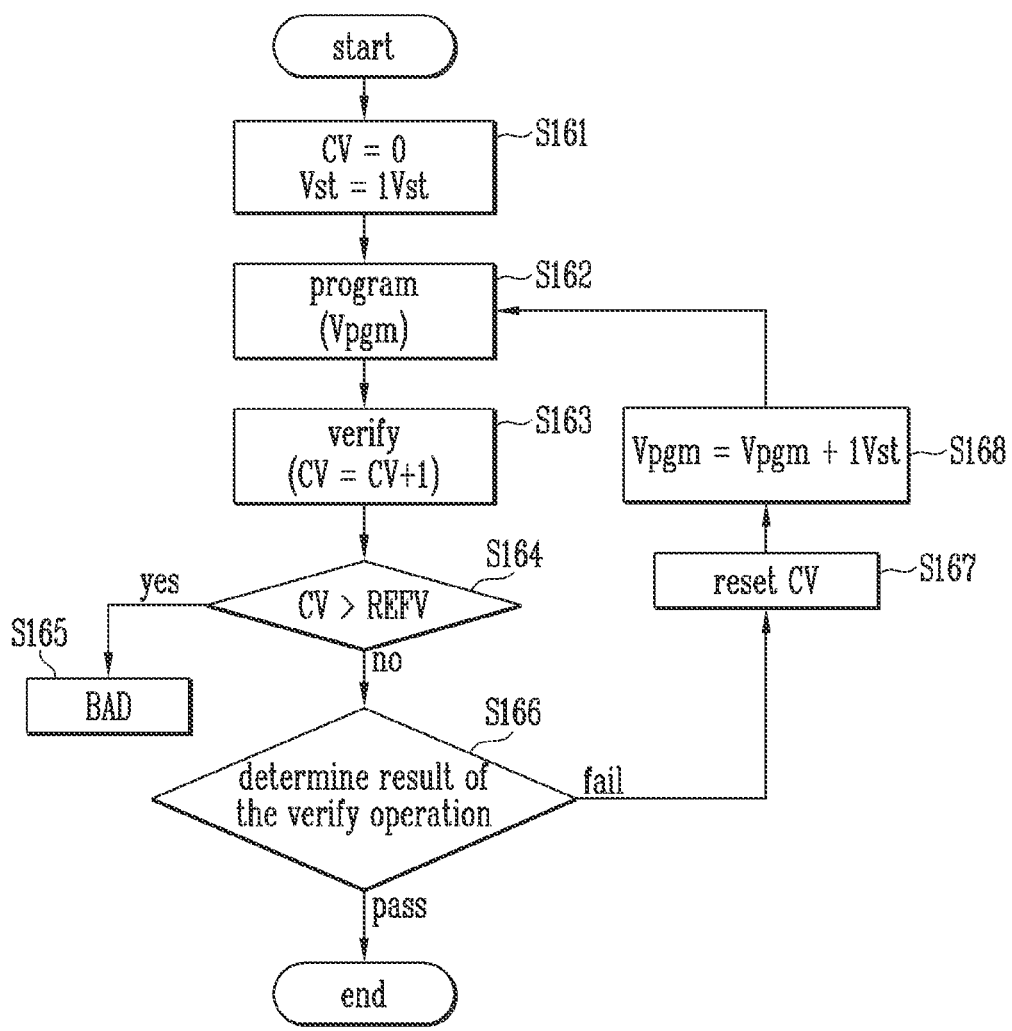
FIG. 16 is a flowchart illustrating a program operation according to a third embodiment of the present disclosure.

FIG. 16 is a flowchart illustrating a program operation according to a third embodiment of the present disclosure.

Referring to FIG. 16, in the third embodiment, a selected memory block may be processed as a bad block depending on the number of verify operations performed in a program operation. The program operation according to the third embodiment will be described below.

When a program operation is started, a count value CV may be set to 0, which is an initial value, and a step voltage Vst may be set to a first step voltage 1Vst at step S161. The count value CV may be the number of verify operations or the number of verify voltages used in the verify operations, and may be set to an initial value before the program operation is started or when the program operation is started. The first step voltage 1Vst is a voltage set by default, and may be a voltage difference between program voltages gradually raised in the program operation of the ISPP method.

When the count value CV and the step voltage Vst are set, a program voltage Vpgm may be applied to a selected word line at step S162. For example, the program voltage Vpgm may be applied to the selected word line, and a pass voltage may be applied to unselected word lines. The program voltage Vpgm may be a voltage for raising the threshold voltage of memory cells, and the pass voltage may be a voltage for forming a channel in a string by turning on the memory cells.

When the program voltage Vpgm is applied to the selected word line for a predetermined time period, a verify operation of the memory cells coupled to the selected word line, that is, a verify operation of the selected page, may be performed at step S163. During the verify operation, a verify voltage may be applied to the selected word line, and the pass voltage may be applied to the unselected word lines. When the verify operation is performed once, the count value CV may increase by 1. Therefore, when a plurality of verify operations are performed in a single program loop, the count value CV may increase by the number of verify operations that are performed.

When the verify operation of the selected page is terminated at step S163, the operation for determining whether the count value CV is greater than a reference value REFV may be performed at step S164.

When it is determined that the count value CV is equal to or less than the reference value REFV (no), the operation of determining the result of the verify operation performed at step S163 may be performed at step S166.

When it is determined at step S166 that all of the verify operations pass, the program operation of the selected page may be terminated. When it is determined at step S166 that there is a verify operation that fails, among the verify operations, the count value CV is reset at step S167, and the program voltage Vpgm may be newly set to a voltage that is raised by the first step voltage 1Vst at step S168. Step S162 may be performed using the newly set program voltage Vpgm.

Steps S162 to S168 may be repeatedly performed until all of the verify operations pass at step S166.

However, when it is determined at step S164 that the count value CV is greater than the reference value REFV (yes), the program operation of the selected memory block is terminated, and the selected memory block may be processed as a bad block at step S165. When the count value CV is greater than the reference value REFV, this indicates that slow cells are included in the selected page. These slow cells may be cells, the electrical characteristics of which are relatively highly likely to be degraded, compared to other memory cells, when program and erase operations of the selected memory block are repeated, and when the number of memory cells, the electrical characteristics of which are degraded, increases in the selected memory block, the possibility that the selected memory block becomes a bad block increases. Therefore, in order to prevent a situation in which the memory block storing valid data suddenly becomes a bad block and the data cannot be restored, the memory block that is highly likely to be a bad block is processed as a bad block in advance using the count value CV, whereby the reliability of the memory device may be improved.

The memory block processed as the bad block may be processed such that access thereto is prohibited in the following program operation. For example, the controller (1200 in FIG. 1) may store the address of the memory block that is designated as the bad block, and may allocate only normal memory blocks as the block for storing data by referring to the address of the memory block designated as the bad block when a program operation is performed.

Figure 17:
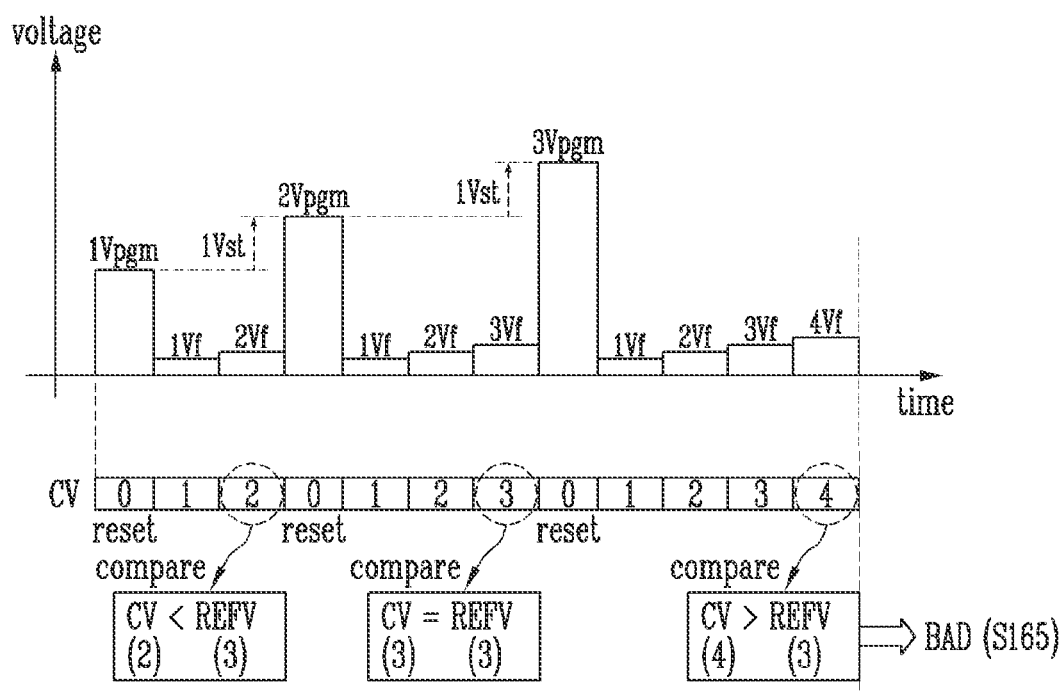
FIG. 17 is a diagram illustrating in detail the program operation described in the third embodiment.

FIG. 17 is a diagram illustrating the program operation described in the third embodiment.

Referring to FIG. 17, a first program loop may be performed in the state in which the first step voltage 1Vst is set as a default voltage and in which the count value CV is reset to 0.

When the first program loop is started, a first program voltage 1Vpgm may be applied to the selected word line. Here, because a verify operation is not yet performed, the count value CV is 0.

After the first program voltage 1Vpgm is applied to the selected word line for a predetermined time period, a first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the verify operations (the first and second verify operations) set in the first program loop are performed, the operation of comparing the count value CV with the reference value REFV may be performed. When the reference value REFV is assumed to be set to 3, because the count value CV is 2 after the first program loop is terminated, the count value CV is determined to be less than the reference value REFV. Therefore, the program operation may be continuously performed.

When all of the first and second verify operations performed in the first program loop are determined to fail, the count value CV is reset to 0, and a second program loop may be performed.

The second program voltage 2Vpgm used in the second program loop may be a voltage that is the first step voltage 1Vst higher than the first program voltage 1Vpgm. When the second program voltage 2Vpgm is applied to the selected word line, the count value CV is not counted, thereby being maintained at 0.

After the second program voltage 2Vpgm is applied to the selected word line for a predetermined time period, the first verify operation using the first verify voltage 1Vf may be performed. When the first verify operation is performed, the count value CV becomes 1. In this way, the second and third verify operations respectively using the second and third verify voltages 2Vf and 3Vf may be sequentially performed. Because the two verify operations (the second and third verify operations) are performed after the first verify operation in the second program loop, the count value CV becomes 3.

When all of the verify operations (the first to third verify operations) set in the second program loop are performed, the operation of comparing the count value CV with the reference value REFV may be performed. Because the count value CV is 3 after the second program loop is terminated, the count value CV is determined to be equal to the reference value REFV. Therefore, the program operation may be continuously performed.

When all of the first to third verify operations performed in the second program loop are determined to fail, the count value CV is reset to 0, and a third program loop may be performed.

The third program voltage 3Vpgm used in the third program loop may be a voltage that is the first step voltage 1Vst higher than the second program voltage 2Vpgm. When the third program voltage 3Vpgm is applied to the selected word line, because the count value CV is not counted, the count value CV is maintained at 0.

After the third program voltage 3Vpgm is applied to the selected word line for a predetermined time period, the first verify operation using the first verify voltage 1Vf may be performed. When the first verify operation is performed, the count value CV becomes 1. In this way, the second to fourth verify operations respectively using the second to fourth verify voltages 2Vf to 4Vf may be sequentially performed. Because the three verify operations (the second to fourth verify operations) are performed after the first verify operation in the third program loop, the count value CV becomes 4.

When all of the verify operations (the first to fourth verify operations) set in the third program loop are performed, the operation of comparing the count value CV with the reference value REFV may be performed. Because the count value CV is 4 after the third program loop is terminated, the count value CV is determined to be greater than the reference value REFV. Accordingly, the program operation is terminated, and the selected memory block is determined to be a potential bad block, thereby being processed as the bad block at step S165.

Figure 18:
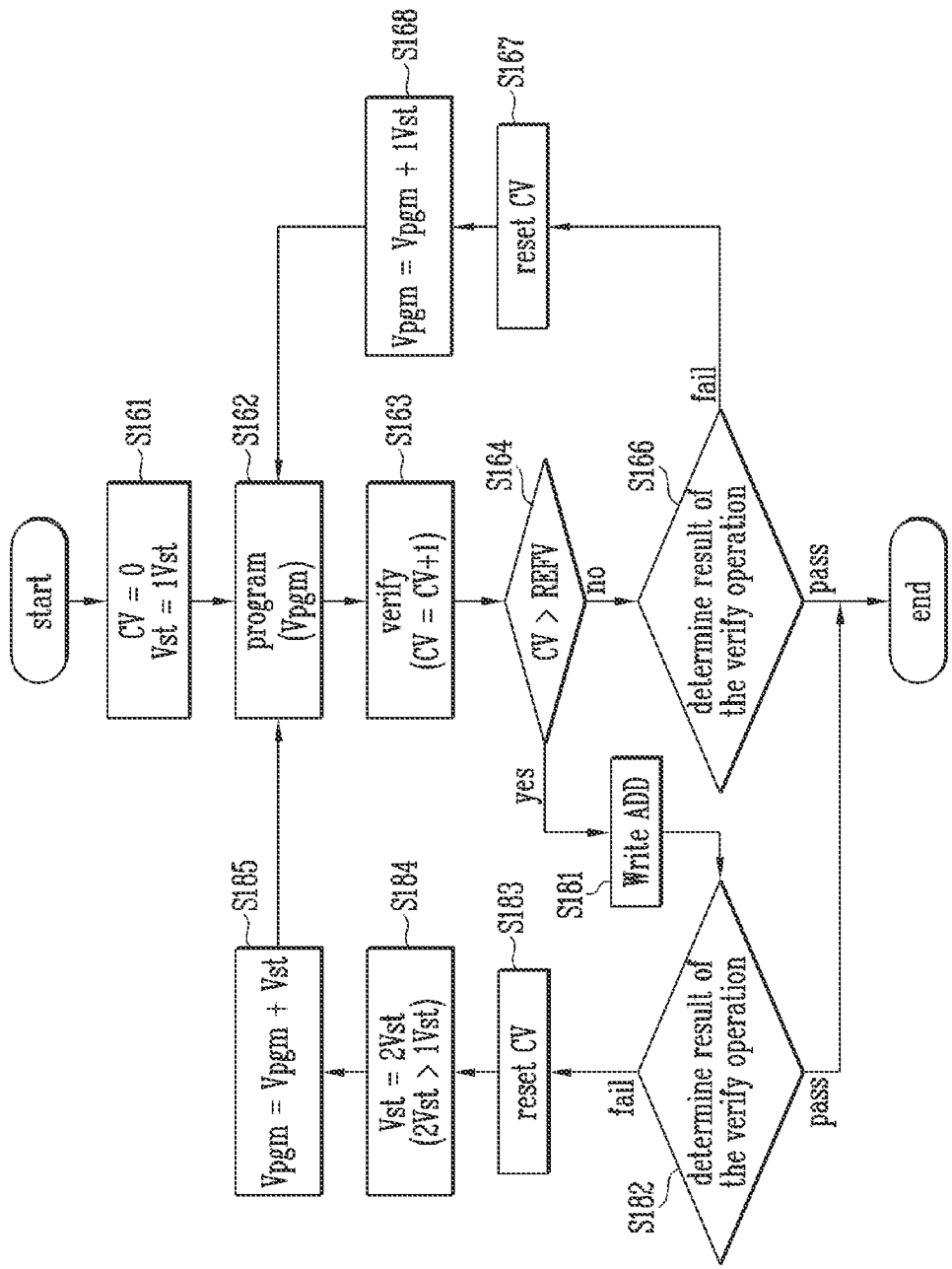
FIG. 18 is a flowchart illustrating a program operation according to a fourth embodiment of the present disclosure.

FIG. 18 is a flowchart illustrating a program operation according to a fourth embodiment of the present disclosure.

Referring to FIG. 18, the program operation according to the fourth embodiment may be performed so as to be similar to the program operation according to the third embodiment, and processing the selected memory block as a bad block in the third embodiment may be partially changed.

For example, steps S161 to S168, excluding step S165, in the third embodiment may be performed in the same manner in the fourth embodiment. Therefore, a description of steps S161 to S168 repeated in the third embodiment will be omitted.

At step S164 in the fourth embodiment, when the count value CV is determined to be greater than the reference value REFV (yes), the address of the selected memory block is recorded in the memory device (1100 in FIG. 1) or the controller (1200 in FIG. 1) at step S181, and the program operation of the selected memory block may be continuously performed.

When the address of the selected memory block is recorded in the memory device or the controller at step S181, the operation of determining the result of the verify operation performed at step S163 may be performed at step S182.

When it is determined at step S182 that all of the verify operations pass, the program operation of the selected page may be terminated. When it is determined at step S182 that there is a verify operation that fails, among the verify operations, the count value CV is reset at step S183, and the step voltage Vst may be set to a second step voltage 2Vst that is higher than the first step voltage 1Vst at step S184. That is, when the count value CV is greater than the reference value REFV, this indicates that a small number of verify operations pass and that slow cells are included in the selected page. Accordingly, the step voltage Vst may be set to the second step voltage 2Vst, which is higher than the first step voltage 1Vst, at step S184 in order to quickly raise the threshold voltage of the slow cells.

Subsequently, at step S185, the program voltage Vpgm may be raised by the step voltage Vst set at step S184. For example, the program voltage Vpgm may be set to a voltage that is the second step voltage 2Vst higher than the previous program voltage Vpgm. The program voltage application operation using the program voltage Vpgm set at step S185 may be performed at step S162.

In this way, steps S162 to S164 and S181 to S185 may be repeatedly performed until all of the verify operations of the selected page pass.

When the program operation is terminated because all of the verify operations of the selected page pass, the selected memory block may be managed as a block that is highly likely to be a bad block, rather than as a normal block, based on the address of the selected memory block, which is recorded at step S181. For example, the operation of copying the data stored in the selected memory block into a normal memory block may be performed, or the operation of reducing the number of attempts to access the selected memory block may be performed. Additionally, a method for managing a memory block that is highly likely to be a bad block may be performed, but because there are various methods for managing bad blocks, a specific description related thereto will be omitted in the fourth embodiment.

Figure 19:
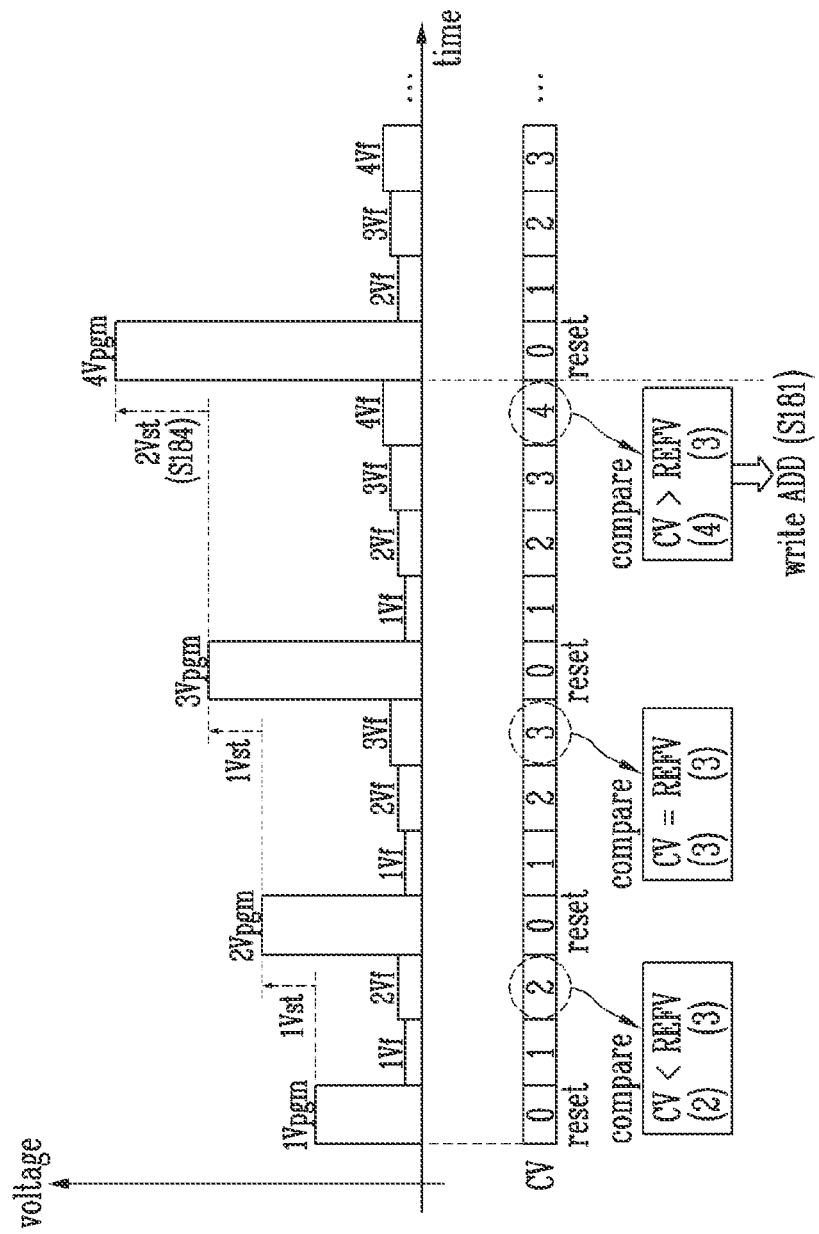
FIG. 19 is a diagram illustrating a program operation depending on a count value in the fourth embodiment.

FIG. 19 is a diagram illustrating in detail a program operation depending on the count value in the fourth embodiment.

Referring to FIG. 19, a first program loop may be performed in the state in which the first step voltage 1Vst is set as a default voltage and in which the count value CV is reset to 0.

When the first program loop is started, a first program voltage 1Vpgm may be applied to the selected word line. Here, because a verify operation is not yet performed, the count value CV is 0.

After the first program voltage 1Vpgm is applied to the selected word line for a predetermined time period, a first verify operation using a first verify voltage 1Vf may be performed. When the first verify operation is performed, the count value CV becomes 1. Then, a second verify operation using a second verify voltage 2Vf may be performed. When the second verify operation is performed, the count value CV becomes 2.

When all of the verify operations (the first and second verify operations) set in the first program loop are performed, the operation of comparing the count value CV with the reference value REFV may be performed. When the reference value REFV is assumed to be set to 3, because the count value CV is 2 after the first program loop is terminated, the count value CV is determined to be less than the reference value REFV. Therefore, the program operation may be continuously performed.

When all of the first and second verify operations performed in the first program loop are determined to fail, the count value CV is reset to 0, and a second program loop may be performed.

The second program voltage 2Vpgm used in the second program loop may be a voltage that is the first step voltage 1Vst higher than the first program voltage 1Vpgm. When the second program voltage 2Vpgm is applied to the selected word line, the count value CV is not counted, thereby being maintained at 0.

After the second program voltage 2Vpgm is applied to the selected word line for a predetermined time period, the first verify operation using the first verify voltage 1Vf may be performed. When the first verify operation is performed, the count valued CV becomes 1. In this way, the second and third verify operations respectively using the second and third verify voltages 2Vf and 3Vf may be sequentially performed. Because the two verify operations (the second and third verify operations) are performed after the first verify operation in the second program loop, the count value CV becomes 3.

When all of the verify operations (the first to third verify operations) set in the second program loop are performed, the operation of comparing the count value CV with the reference value REFV may be performed. Because the count value CV is 3 after the second program loop is terminated, the count value CV is determined to be equal to the reference value REFV. Accordingly, the program operation may be continuously performed.

When all of the first to third verify operations performed in the second program loop are determined to fail, the count value CV is reset to 0, and a third program loop may be performed.

The third program voltage 3Vpgm used in the third program loop may be a voltage that is the first step voltage 1Vst higher than the second program voltage 2Vpgm. When the third program voltage 3Vpgm is applied to the selected word line, the count value CV is not counted, thereby being maintained at 0.

After the third program voltage 3Vpgm is applied to the selected word line for a predetermined time period, the first verify operation using the first verify voltage 1Vf may be performed. When the first verify operation is performed, the count value CV becomes 1. In this way, the second to fourth verify operations respectively using the second to fourth verify voltages 2Vf to 4Vf may be sequentially performed. Because the three verify operations (the second to fourth verify operations) are performed after the first verify operation in the third program loop, the count value CV becomes 4.

When all of the verify operations (the first to fourth verify operations) set in the third program loop are performed, the operation of comparing the count value CV with the reference value REFV may be performed. Because the count value CV is 4 after the third program loop is terminated, the count value CV is determined to be greater than the reference value REFV.

As described above, when the count value CV is determined to be greater than the reference value REFV, the address of the selected memory block is recorded as the address to be managed at step S181, and the program operation of the selected memory block may be continuously performed.

When at least one of the first to fourth verify operations performed in the third program loop fails, the count value CV is reset to 0, and a fourth program loop may be performed.

The fourth program voltage 4Vpgm used in the fourth program loop may be the second step voltage 2Vst higher than the third program voltage 3Vpgm. That is, because the count value CV is greater than the reference value REFV when the third program loop is terminated, the step voltage Vst is set to the second step voltage 2Vst that is higher than the first step voltage 1Vst, and the second step voltage 2Vst may be applied from the fourth program loop.

Figure 20:
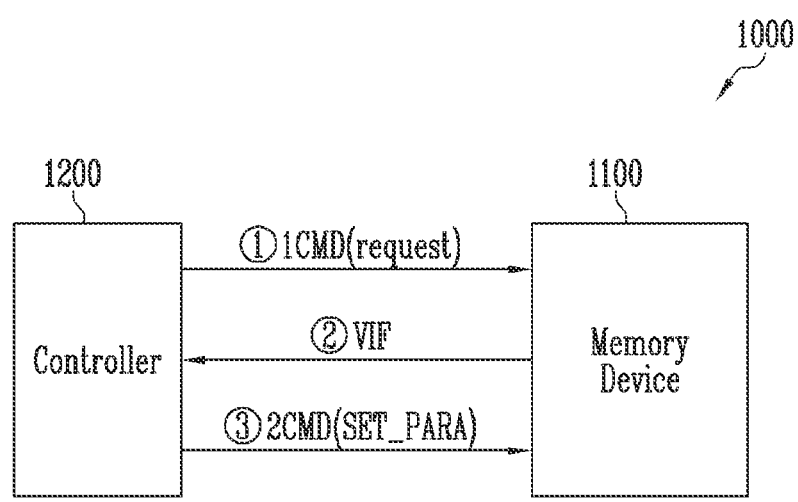
FIG. 20 is a diagram illustrating the operation of a memory system according to an embodiment of the present disclosure.

FIG. 20 is a diagram illustrating the operation of a memory system according to an embodiment of the present disclosure.

Referring to FIG. 20, when a step voltage is changed in the above-described first to fourth embodiments, parameters related to a program operation may be changed such that the changed step voltage is applied in the next program operation. For example, when the program operation of a selected memory block is terminated, the controller 1200 may output a first command 1CMD for requesting information about the verify operation to the memory device 1100 (①).

In response to the first command 1CMD, the memory device 1100 may transmit verify information VIF, including information about the number of verify operations that are counted in the program operation of the selected memory block or about the number of verify voltages, to the controller 1200 (②).

The controller 1200 may transmit a second command 2CMD, which may change set_para, to the memory device 1100 (③) in order to change the step voltage according to the verify information VIF. In response to the second command 2CMD, the memory device 1100 may change the set_para. Here, the set_para indicates parameters that are set values for various operations performed by the memory device 1100. For example, the set_para may be the set values for various operations, such as the level of a program start voltage, the level of the step voltage, the time at which the program voltage is applied to a selected word line, and the like.

The present disclosure may improve the reliability of a memory device by adjusting a program operation in consideration of the characteristics of slows cells and fast cells.

What is claimed is:

1. A memory device, comprising:
   an operation code generator configured to generate a program code and a verify code in response to a program control code and to output an operation code using the program code and the verify code;
   a verify counter configured to store a count value acquired by counting a number of times a verify operation is performed depending on the verify code;
   a verify determiner configured to compare the count value with a reference value depending on a result of the verify operation and to generate the program control code such that a step voltage for raising a program voltage is raised when the count value is greater than the reference value, decreased when the count value is less than the reference value, and maintained at a default voltage when the count value is equal to the reference value depending on a comparison result; and
   a voltage generator configured to generate the program voltage and a verify voltage depending on the operation code.

2. The memory device according to claim 1, wherein the operation code generator comprises:
   a program operation controller configured to generate the program code in response to the program control code; and
   a verify operation controller configured to generate the verify code in response to the program control code.

3. The memory device according to claim 2, wherein:
   the program code includes information about a level of the program voltage changed depending on the program control code, a level of the step voltage, and a time at which the program voltage is output from the voltage generator, and
   the verify code includes information about a level of the verify voltage changed depending on the program control code and a time at which the verify voltage is output from the voltage generator.

4. The memory device according to claim 1, wherein the verify counter comprises:
   a counter configured to accumulate the count value depending on the verify code and to store the count value; and
   a counter controller configured to control the counter in response to an output signal output from the verify determiner.

5. The memory device according to claim 4, wherein the counter controller outputs one of a first count code for outputting the count value stored in the counter and a second count code for resetting the counter in response to the output signal.

6. The memory device according to claim 1, wherein the verify determiner comprises:
   a first determiner configured to output one of a first program-processing code for performing a next program loop and a second program-processing code for performing a program termination depending on the result of the verify operation, and to output an output signal for outputting the count value; and
   a second determiner configured to compare the count value with the reference value and output a verify-processing code depending on the comparison result.

7. The memory device according to claim 6, wherein the first determiner outputs the second program-processing code as a code for the program termination when the result of the verify operation is a pass, and outputs the first program-processing code as a code for performing the next program loop when the result of verify operation is a fail.

8. The memory device according to claim 6, wherein the second determiner stores the reference value, compares the count value with the reference value when the count value is input, and outputs the verify-processing code depending on the comparison result.

9. The memory device according to claim 6, wherein the verify determiner generates the program control code using the verify-processing code and one of the first program-processing code and the second program-processing code.

10. The memory device according to claim 6, wherein the reference value is an average number of times a verify operation of normal memory cells passes, and the reference value is stored in the second determiner through a test operation of the memory device.

11. The memory device according to claim 1, wherein the voltage generator generates a first program voltage to be used in a first program loop, generates a second program voltage to be used in a second program loop, and generates a voltage that is the step voltage higher than the first program voltage as the second program voltage.

12. A method of operating a memory device, comprising:
    raising a threshold voltage of memory cells by applying a first program voltage to a selected word line;
    performing a verify operation for determining whether the threshold voltage of the memory cells is equal to or greater than a target voltage;
    storing a count value by counting a number of times the verify operation is performed;
    comparing the count value with a reference value when the verify operation fails;
    setting a step voltage depending on a result of comparing the count value with the reference value; and
    generating a second program voltage, which is higher than the first program voltage by the step voltage, and programming the memory cells using the second program voltage,
    wherein setting the step voltage is configured such that:
    the step voltage is maintained at the default voltage when the count value is equal to the reference value,
    the step voltage is set higher than the default voltage when the count value is greater than the reference value, and
    the step voltage is set lower than the default voltage when the count value is less than the reference value.

13. The method according to claim 12, wherein the count value is reset depending on a program loop, which includes raising the threshold voltage of the memory cells and performing the verify operation.

14. The method according to claim 13, wherein the count value is reset whenever the program loop is changed, is reset whenever the program loop is performed a plurality of times, or is reset when a program operation of the memory cells is terminated.

15. The method according to claim 12, further comprising:

stopping following steps and processing a memory block including the memory cells as a bad block when the count value is greater than the reference value.

16. The method according to claim 15, wherein the memory block processed as the bad block is prevented from being accessed.

17. The method according to claim 12, further comprising:
after comparing the count value with the reference value and before setting the step voltage, storing an address of a memory block including the memory cells when the count value is greater than the reference value.

18. The method according to claim 17, wherein a number of times the memory block, the address of which is stored, is accessed decreases in a next program operation.

* * * * *